United States Patent
Xia et al.

(10) Patent No.: US 11,784,316 B2
(45) Date of Patent: *Oct. 10, 2023

(54) LAYERED PLATINUM ON FREESTANDING PALLADIUM NANO-SUBSTRATES FOR ELECTROCATALYTIC APPLICATIONS AND METHODS OF MAKING THEREOF

(71) Applicant: Georgia Tech Research Corporation, Atlanta, GA (US)

(72) Inventors: Younan Xia, Atlanta, GA (US); Shuifen Xie, Fujian (CN); Sang-Il Choi, Atlanta, GA (US); Xue Wang, Atlanta, GA (US); Jinho Park, Atlanta, GA (US); Lei Zhang, Fujian (CN)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/391,757

(22) Filed: Aug. 2, 2021

(65) Prior Publication Data
US 2021/0367243 A1 Nov. 25, 2021

Related U.S. Application Data

(62) Division of application No. 14/659,879, filed on Mar. 17, 2015, now Pat. No. 11,114,671.

(51) Int. Cl.
| | |
|---|---|
| *H01M 4/86* | (2006.01) |
| *H01M 4/92* | (2006.01) |
| *C30B 29/60* | (2006.01) |
| *C30B 7/14* | (2006.01) |
| *C30B 29/02* | (2006.01) |
| *C30B 7/00* | (2006.01) |

(Continued)

(52) U.S. Cl.
CPC ........... *H01M 4/8657* (2013.01); *B01J 23/42* (2013.01); *B01J 23/44* (2013.01); *C30B 7/005* (2013.01); *C30B 7/14* (2013.01); *C30B 29/02* (2013.01); *C30B 29/60* (2013.01); *C30B 29/66* (2013.01); *H01M 4/92* (2013.01); *H01M 2008/1095* (2013.01)

(58) Field of Classification Search
None
See application file for complete search history.

(56) References Cited

U.S. PATENT DOCUMENTS

| | | | |
|---|---|---|---|
| 7,691,780 B2 | 4/2010 | Adzic | |
| 9,878,306 B2* | 1/2018 | Qin | B22F 1/0547 |

(Continued)

OTHER PUBLICATIONS

Aaltonen, et al., "Atomic Layer Deposition of Platinum Thin Films". Chem. Mater.. 15:1924-8 (2003).

(Continued)

*Primary Examiner* — Maria Laios
*Assistant Examiner* — Angela J Martin
(74) *Attorney, Agent, or Firm* — THOMAS | HORSTEMEYER, L.L.P.

(57) ABSTRACT

Core-shell nanostructures with platinum overlayers conformally coating palladium nano-substrate cores and facile solution-based methods for the preparation of such core-shell nanostructures are described herein. The obtained Pd@Pt core-shell nanocatalysts showed enhanced specific and mass activities towards oxygen reduction, compared to a commercial Pt/C catalyst.

19 Claims, 24 Drawing Sheets

(51) Int. Cl.
    *C30B 29/66*     (2006.01)
    *B01J 23/42*     (2006.01)
    *B01J 23/44*     (2006.01)
    *H01M 8/10*     (2016.01)

(56) References Cited

U.S. PATENT DOCUMENTS

| | | | |
|---|---|---|---|
| 10,201,804 B2* | 2/2019 | Karpov | B01J 23/40 |
| 2012/0034550 A1* | 2/2012 | Xia | B82Y 30/00 |
| | | | 117/64 |
| 2012/0280224 A1* | 11/2012 | Doolittle | H01L 31/032 |
| | | | 257/43 |
| 2013/0178357 A1 | 7/2013 | Adzic et al. | |
| 2014/0024524 A1* | 1/2014 | Roh | H01M 4/926 |
| | | | 977/734 |
| 2015/0069015 A1 | 3/2015 | Xia et al. | |
| 2016/0008241 A1 | 1/2016 | Gallino et al. | |

OTHER PUBLICATIONS

Adzic, et al., "Platinum monolayer fuel cell electrocatalysts", Top Catal 46:249-62 (2007).
Alia, et al., "Platinum-coated palladium nanotubes as oxygen reduction reaction electrocatalysts", ACS Catal., 2:858-63 (2012).
Brankovic, et al. "Metal monolayer deposition by replacement of metal adlayers on electrode surfaces", Surface Science, 474:L173-9 (2001).
Choi, et al., "Synthesis arid characterization of 9 nm Pt—Ni octahedral with a record high activity eof 3.3 A/mg (Pt) for the oxygen reduction reaction", Nano Lttr., 13:3420-5 (2013).
Debe, "Electrocatalyst approaches and challenges for automotive fuel cells", Nature, 486:43-51 (2012).
Fan, et al., "Epitaxial growth of tleterogeneous metal nanocrystals: from gold nano-octahedra to palladium and silver nanocubes", J. Am. Chem. Soc., 130 :694 9-51 (2008 ).
Gao, et al., "Highly stable sliver nanoplates for surface plasmon resonance biosensing", Angew Chem Int Ed., 51 :5629-33 (2012).
Jin, et al. , "Palladium nanocryslals enclosed by {100} and {111} facets in controlled proportions ar.d their catalytic activities for formic acid oxidation". Energy Environ. Sci.,5:r33!'>2 7 (2012).
Jin, et a., "Synthesis of Pd nanooystals enclosed by {100} facets and with sizes <10 nm for application in CO oxidahon", Nano Res , 4:83 91 (20-11 ).
Koenigsmann, et al., "Enhanced eloctrocatalyiic peliormance of processed, ultrathin, supported Pd—Pt core-shell nanowlre catalysts for the oxygen", JACS, 133:9783-95 (2011 ).
Liu, et al., OSelf-terminating growth of platinum films by electrochemical k:Jeposition. Science, 338:1327-30 (2012).
Lv, et al., "Controlled synthesis of nanosized palladium icosahedra and their catalytic activity towards formic-acid oxidation", ChemSusChem., 6:1923-30 (2013).
Mackus, et al, "Influence of Oxygen Exposure on the Nucleation of Platinum Atomic Layer Deposition: Consequences for Film Growth, Nanopatterning, and Nanoparticle Synthesis", Chem. Mater., 25:1905-11(2013).
Park, et al., "Atomic Layer-by-Layer Deposition of Platinum on Palladium Octahedra for Enhanced Catalysts toward the Oxygen Reduction Reaction", ACS Nano, 9(3):2635-47 (2015).
Peng, et al., Designer platinum nanopartides: Control of shape, composition in alloy, nanostructure and electrocatalytic property Nano Today, 4:143-64 (2009).
Sasaki, et al., "Core-procted platinum monolayer shell high-stability electrocatalysts for fuekell cathodes", Angew Chem Int Ed., 49:8602-7 (2010).
Sasaki, et al., "Highly stable Pt monolayer on PdAu nanoparticle electrocatalysts for the oxygen reduction reaction". Nat. Commun., doi: 10.1038 (2012).
Stamenkovic, et al., "Trends in electrocatalysis on extended and nanoscale Pt-bimetallic alloy surfaces", Nature Materials, 6:241-247 (2007a).
Stamenkovic, et al., "Improved oxygen reduction activity on Pt3Ni(111) via increased surface site availability", Science, 315:493-9 (2007b).
Steele, et al., "Materials for fuel-cell technologies", Nature, 414:345? 52 (2001).
Strasser, et al., "Lattice-strain control of the activity in dealloyed core-shell fuel cell catalysts", Nature Chem., 2:454-60 (2010).
Toyoda, et al., "Catalytic activity of Pt/TaB2(0001) for the oxygen reduction reaction", Angew. Chem., Int. Ed., 52:4137-40 (2013 ).
Vukmirovic, et al., "Platinum monolayer electrocaralysts for oxygen reduction", Electrochimica Acta, 52:2257-63 (2007).
Xie, et al., "Atomic layer-by-layer deposition of Pt on Pd nanocubes for catalysts with enhanced activity and durability toward oxygen", Nano Lttr., 14(6):3570-6 (2014).
Zhang, et al., "Controlling the catalytic activity of platinum-monolayer electrocatalysts for oxygen reduction with different substrate", Angew. Chem. Int Ed,,44:2132-5 (2005).
Zhang, et al., Platinum monolayer electrocalalysts for 0-2 reduction: Pi monolayer on Pd(111) and on carbon-supported Pd nanoparticles J, Phys. Chem. B., 108:10955-64 (2004).
Zhang, et al., "nanocrystals composed of alternating shells of Pd and Pt can be obtained by sequentially adding different precursors", JAGS, 133:10422-5 (2011).
Zhang, et al., "Enhancing the catalytic and electrocatalytic properties of Pt-based catalysts by forming bimetallic nanocrystals with Pd", Chem Soc Rev., 41 :8035-49 (2012).

\* cited by examiner

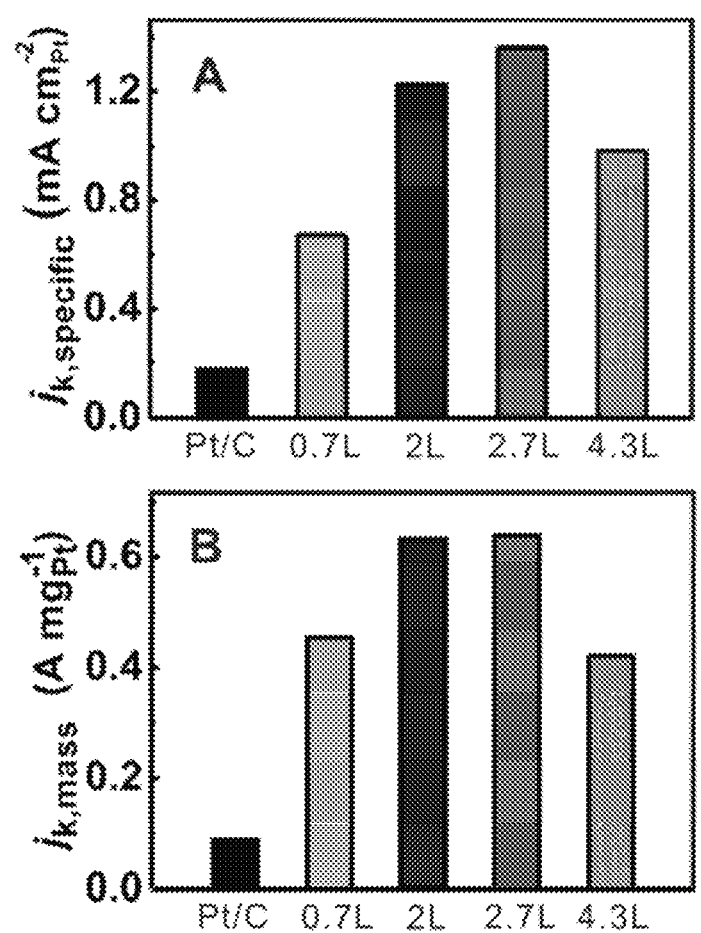
FIG. 22A-B

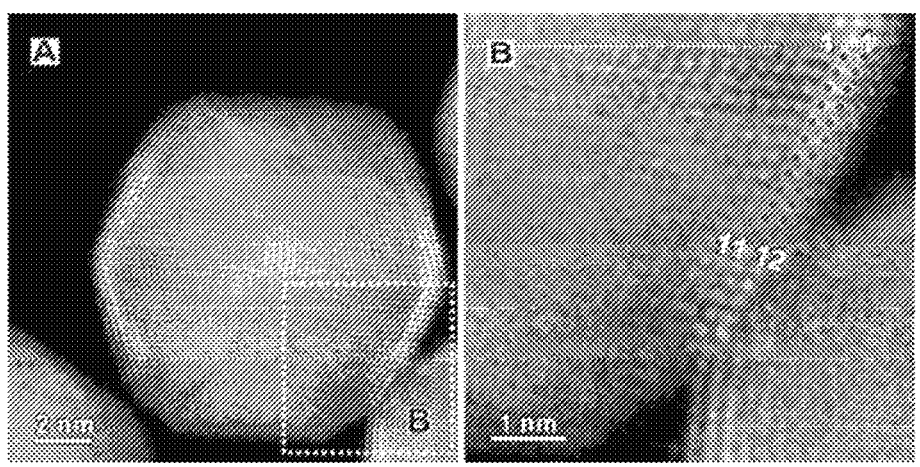
FIG. 23A-B

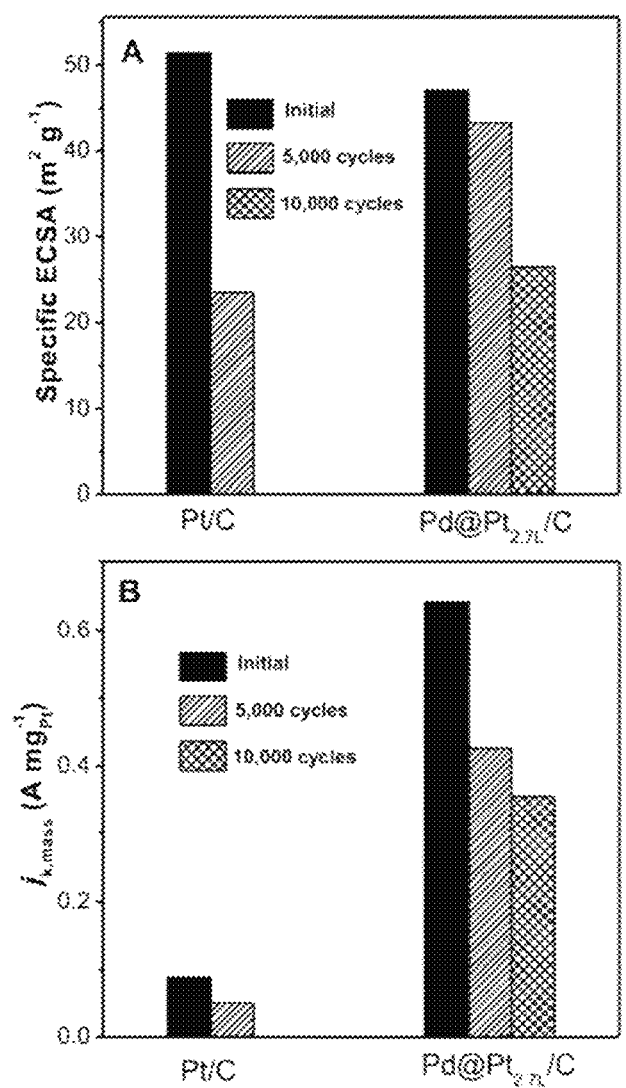
FIG. 24A-B

LAYERED PLATINUM ON FREESTANDING PALLADIUM NANO-SUBSTRATES FOR ELECTROCATALYTIC APPLICATIONS AND METHODS OF MAKING THEREOF

CROSS-REFERENCE TO RELATED APPLICATIONS

This application is a divisional application that claims the benefit of and priority to co-pending U.S. Nonprovisional patent application Ser. No. 14/659,879, filed on Mar. 17, 2015, the contents of which are incorporated by reference herein in its entirety.

STATEMENT REGARDING FEDERALLY SPONSORED RESEARCH OR DEVELOPMENT

This invention was made with government support under Grant No. DMR1215034 awarded by the National Science Foundation. The government has certain rights in the invention.

FIELD OF THE INVENTION

The present invention generally relates to layered platinum on freestanding palladium nano-substrates, methods of making such nanostructures, and catalytic uses thereof.

BACKGROUND OF THE INVENTION

Because platinum is one of the scarcest noble metals on the planet, the availability of platinum has become a major concern for existing and emerging applications using platinum catalysts. For example, platinum catalysts are typically the most common catalysts used in the oxygen reduction reaction (ORR), which occurs on the cathode of a proton-exchange membrane fuel cell (PEMFC); see Steele, B. et al. *Nature* 2001, 414, 345-332 and Debe, M. K. *Nature* 2012, 486, 43-51.

Various studies have been carried out to increase the utilization efficiency of platinum and concurrently reduce the content of platinum in a catalyst. Methods are being developed to improve the activities of platinum-based catalysts. One of the most promising approaches has been to deposit platinum atoms as ultrathin skins of only a few atomic layers onto nanoparticles made of more abundant and/or less expensive metal or metal alloys; see Sasaki, K. et al. *Nat. Commun,* 2012, doi: 10.1038/ncomms2124 and Zhang, J. et al. *Angew. Chem. Int. Ed.* 2005, 44, 2132-2135. Such deposition of only a few atomic layers of platinum on the surface of facet-controlled nanocrystals made of another metal, such as palladium, provides an attractive strategy for maximizing the activity in terms of the platinum mass loading.

For single-crystal substrates, it has been shown that ultrathin coatings of platinum with well-controlled thicknesses can be achieved via vacuum deposition, followed by annealing at a very high temperature ($\geq 1000°$ C.); see Toyoda, E. et al. *Angew. Chem., Int. Ed.* 2013, 52, 4137-4140. Nevertheless, a limitation of this technique is that it cannot be extended to substrates having nanometer sizes or to form coatings on substrates in solution phase.

U.S. Pat. No. 7,691,780 to Adzic et al. describes palladium or palladium alloy particles coated with platinum layer(s) which were electrodeposited via a method which involves first underpotentially depositing (UPD) copper monolayers or sub-monolayers on palladium or palladium alloy particles and then contacting the copper-coated particles with a platinum salt to cause spontaneous redox displacement of the copper atomic layer to firm a platinum layer. These platinum coated palladium or palladium-alloy particles were shown to possess enhanced mass activity toward ORR. Adzic and co-workers workers (Zhang, J. et al. *J. Phys. Chem. B* 2004, 108, 10955-10964) reported that platinum monolayers deposited by such displacement of a copper atomic layer by a platinum consisted of interconnected islands on the surface of the palladium particles with increased atomic scale roughness. The platinum-coated palladium particles described by Adzic et al. therefore were shown to suffer from surface coverage issues. The method of deposition described is based on electrochemical approach, which could limit the scalability for producing such particles.

While prior studies have demonstrated the feasibility of generating Pd@Pt core-shell nanocrystals having ultrathin skins of platinum, it has been extremely difficult (or even impossible) to precisely and reliably control the thicknesses of the platinum overlayers down to the atomic scale. For example, traditional atomic layer deposition (ALD) in a gas phase and most of the solution-phase methods reported thus far often generate platinum overlayers with a polycrystalline structure and uneven thickness; see Aaltonen, T. et al. *Chem. Mater.* 2003, 15, 1924-1928 and Mackus, A. J. M. et al. *Chem. Mater.* 2013, 25, 1905-1911. Owing to the intrinsic high surface free energy and interatomic bond energy (307 kJ/mol) of platinum, direct deposition of platinum tends to favor an island growth mode (Volmer-Weber mode) see Fan, F.-R. et al. *J. Am. Chem. Soc.* 2008, 130, 6949-6951 and Peng, Z. et al. *Nano Today* 2009, 4, 143-164. Methods developed to-date have been based on solution phase synthetic conditions which are too mild to provide sufficient thermodynamic energy to break down the limitation of the strong platinum-platinum interaction. As a result, the newly formed reduced platinum atoms preferentially self-nucleate, rather than tile on the surface of palladium nano-substrates (seeds).

Challenges and difficulties remain in the synthesis of core-shell nanostructures formed by deposition of layers of platinum on the surface of the nanoscale palladium substrates having precise control at the atomic scale. Development of such core-shell nanostructures can lead to efficient ORR catalysts which can dramatically increase the efficiency of fuel cells.

Thus, there exists a need for platinum on palladium core-shell nanostructures having platinum overlayers with precisely and reliably controlled thicknesses, as well as development of novel methods of producing such core-shell nanostructures. There is also a need for such platinum on palladium core-shell nanostructures for use as catalysts for oxygen reduction reaction (ORR).

Therefore, it is an object of the invention to provide platinum and palladium core-shell nanostructures having conformal platinum overlayers on a palladium core.

It is a further object of the invention to provide facile and scalable solution-based reaction methods and conditions for synthesizing such core-shell nanostructures.

It is another object of the invention is to use the core-shell nano developed as catalytic materials.

It is another object of the invention to use the core-shell nanostructures as oxygen reduction reaction (ORR) catalysts that catalyze oxygen reduction at fuel cell cathodes.

SUMMARY OF THE INVENTION

The present disclosure relates to various embodiments of core-shell nanostructures having platinum overlayers on a nano-substrate core formed of palladium, methods for the preparation of such core-shell nanostructures, and their use in electrocatalytic applications as described herein.

One embodiment is a method wherein palladium nano-substrates act as seeds onto which one or more epitaxially deposited overlayers of zero-valent platinum are formed to produce platinum on palladium nanostructures, denoted Pd@Pt$_{nL}$, wherein the value of "n" denotes the number of platinum overlayers and "L" is an abbreviation of the term layer(s).

The method includes forming core-shell nanostructures having a palladium nano-substrate core and epitaxially depositing one or more conformal overlayers of zero-valent platinum atoms by addition of a solution containing a platinum-containing compound to a solution containing a plurality of the palladium nano-substrates and a reducing agent and heating the mixture to a temperature in the range of about 75 to about 250° C. to induce epitaxial layer-by-layer deposition of one or more platinum overlayers onto the palladium nano-substrates.

Conformal deposition of reduced platinum atoms to form one or more overlayers on the palladium nano-substrates, in general, occurs via an initial deposition of the platinum atoms at corners of the nano-substrates. The surface hound platinum atoms then diffuse away from the corners to the edges and side faces of the palladium nano-substrates. As a result, the morphology of the final core-shell nanostructures is largely determined by the difference in rates responsible for platinum atom deposition ($V_{deposition}$) and surface diffusion ($V_{diffusion}$); see FIG. 1. The $V_{deposition}$ and $V_{diffusion}$ rates can be controlled according to the reaction conditions applied during the method as described further below.

Another embodiment provides a method in which the deposition of the one or more zero-valent platinum overlayers onto the palladium nano-substrates is carried out in a polyol-type solvent, such as ethylene glycol (EG), and the reaction solution is preferably heated to a temperature in the range of about 150 to about 250° C. According to yet another embodiment of the method, the deposition of the one or more zero-valent platinum overlayers onto the palladium nano-substrates can be carried out in a water-based solvent, such as deionized water, and the reaction solution is preferably heated to a temperature in the range of about 85 to about 100° C.

Another embodiment provides a method in which palladium nano-substrates (seeds) onto which epitaxial layer-by-layer deposition of zero-valent platinum overlayers is applied have a shape chosen from the group consisting of cubic, concave cubic, tetrahedral, bipyramidal, octahedral, icosahedral, and decahedral shapes. In certain embodiments the aforementioned nano-substrate shapes can be non-truncated (perfect) or they can be truncated, having various degrees of truncation at the corners and/or edges. In certain other embodiments, the nano-substrates seeds can be rod (i.e., rectangular, pentagonal, octagonal), bar (i.e., rectangular), wire (i.e., rectangular, octagonal, pentagonal), and plate shaped. The selection of shape and/or degree of truncation can be controlled according to the reaction conditions used.

The Pd@Pt$_{nL}$ core-shell nanostructures synthesized according to the methods described herein possess a palladium nano-substrate core conformally coated with one or more atomic overlayers of epitaxially deposited zero-valent platinum atoms. The Pd@Pt$_{nL}$ core-shell nanostructures formed typically adopt the shape of the palladium nano-substrates (seeds) on to which the one or more zero-valent overlayers were deposited onto. In preferred embodiments, the Pd@Pt$_{nL}$ core-shell nanostructures have about one to about ten atomic overlayers of zero-valent platinum deposited onto them typically via epitaxial layer-by-layer growth. The one or more zero-valent platinum overlayers formed are uniformly deposited and can form smooth surfaces on the coated palladium nano-substrates (seeds). The Pd@Pt$_{nL}$ core-shell nanostructures can have an average particle size in the range of about one to about 1000 nm, more preferably about one to about 100 nm.

BRIEF DESCRIPTION OF THE DRAWINGS

FIGS. 3A-C show low-magnification HAADF-STEM images of Pd@Pt$_{6L}$, Pd@Pt$_{4L}$, and Pd@Pt$_{1L}$ nanocubes, respectively; FIGS. 3D-F shows HAADF-STEM images of an individual Pd@Pt$_{6L}$, Pd@Pt$_{4L}$, and Pd@Pt$_{1L}$ nanocube, respectively; FIGS. 3G-I shows atomic-resolution HAADF-STEM images taken from the Pd@Pt$_{6L}$, Pd@Pt$_{4L}$, and Pd@Pt$_{1L}$ nanocube, respectively, revealing the numbers of platinum atomic layers; FIGS. 3J-L shows the EDX line scan profiles of Pd and Pt for the Pd@Pt$_{6L}$, Pd@Pt$_{4L}$, and Pd@Pt$_{1L}$ nanocube along the white arrows marked on FIGS. 3G, 3H, and 3I.

FIGS. 4A, 4B, and 4C show Pd@Pt$_{2-3L}$, Pd@Pt$_{3-4L}$, and Pd@Pt$_{4-5L}$ octahedra as well as the platinum content (wt %) from ICP-MS analysis.

in FIGS. 6A-E, the dark and light regions in the TEM images correspond to palladium and platinum, respectively. FIG. 5F shows the EDX line scan profiles of Pd and Pt for the Pd@Pt$_{2-3L}$ octahedron along the white arrow marked in FIG. 5E.

FIGS. 6A-F shows HAADF-STEM images of the Pd@Pt$_{2-3L}$ octahedra synthesized according to the water-based protocol and the EDX line scan analysis of the octahedra; in FIGS. 6A-E, the dark and light regions in the TEM images correspond to palladium and platinum, respectively. FIG. 6F shows the EDX line scan profiles of Pd and Pt for the Pd@Pt$_{2-3L}$ octahedron along the white arrow marked in FIG. 6E.

FIGS. 7A and 7B show TEM images of the Pd@Pt$_{2.7L}$ icosahedra. FIG. 7C shows an HAADF-STEM image taken from a single Pd@Pt$_{2.7L}$ icosahedra particle along a 2-fold symmetry axis shows three atomic layers of Pt in the shell (with a brighter contrast) and Pd atoms in the core; in FIG. 7D an HAADF-STEM image of two Pd@Pt$_{2.7L}$ icosahedra and the corresponding EDX mapping of Pd and Pt is shown confirming a Pd@Pt core-shell structure. FIGS. 7E and 7F show HAADF-STEM images taken from the edges marked by boxes E and F in FIG. 7C, showing the detailed arrangement of the Pd (labeled 1-14) and Pt (labeled 1-15) atoms. FIGS. 7G and 7H are duplicates of what are shown in FIGS. 7E and F, respectively, demonstrating, the formation of a corrugated structure for the Pt overlayers.

In FIG. 14B, the mass activities are given normalized against the masses of Pt and combined Pd+Pt, respectively.

In FIG. 18B, the mass activities are given normalized against the masses of Pt and combined Pd+Pt, respectively.

FIGS. 22A-B shows bar graphs of the specific and mass ORR activities given as kinetic current densities (j$_k$) normalized to the ECSAs and platinum loading of the Pd@Pt$_{nL}$/C (n=0.7, 2, 2.7, 4.3) icosahedra and commercial Pt/C catalyst at 0.9V (vs. RHE), respectively.

FIGS. 23A-B shows HAADF-STEM images of an individual Pd@Pt$_{2.7L}$ icosahedron along a 2-fold symmetry axis after annealing in the electron microscope at 300° C. for 30 min. FIG. 23B shows an HAADF-STEM image taken from the edge marked by a box in FIG. 23A showing that the corrugated structure of the platinum shell was retained even after heating at 300° C. for 30 min and showing the detailed arrangement of the Pd (labeled 1-11) and Pt (labeled 1-12) atoms.

FIGS. 24A-B shows bar graphs of the specific ECSAs and mass activities, given as the kinetic current densities (j$_k$) at 0.9 V (vs. RHE), of the Pd@Pt$_{2.7L}$/C octahedra and commercial Pt/C ORR catalysts before and after 5,000 and 10,000 cycles during accelerated durability tests.

DETAILED DESCRIPTION OF THE INVENTION

Figure 1:
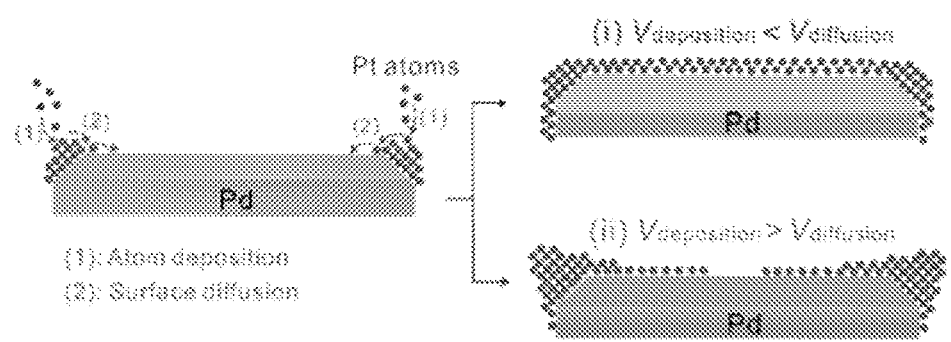
FIG. 1 shows a schematic illustration of the deposition of platinum (Pt) atoms on a palladium (Pd) substrate divided into two major steps: (1) deposition of Pt atoms at the corner sites and (2) surface diffusion of the deposited Pt atoms from the corners to the side faces. When $V_{deposition} < V_{diffusion}$ as shown in (i), the Pt atoms can evenly spread on the entire Pd{100} faces, generating Pd@Pt$_{nL}$ core-shell nanostructures with a well-controlled number of Pt atomic layers. When $V_{deposition} > V_{diffusion}$, as shown in (ii), the majority of the deposited Pt atoms have a tendency to remain at the corner sites.

Platinum on palladium core-shell nanostructures, methods for producing such core-shell nanostructures, and their use as electrocatalysts in oxygen reduction reaction (ORR) are described herein.

I. Definitions

"Adatom", as used herein, refers to atoms associated with (e.g., adsorbed to) a crystal surface of a substrate.

"Conformal," as used herein refers to the ability of a metal layer to assume intimate contact with an underlying surface topography onto which it is deposited.

"Core-shell," as used herein refers to a nanostructure which is denoted as "X@Y$_{nL}$," referring to, for example, a core-shell nanostructure wherein the particle has a core of X and a shell of Y; n denotes the number of overlayers of Y and "L" is an abbreviation of the term layers. The platinum on palladium core-shell nanostructures described herein are denoted as Pd@Pt$_{nL}$.

"Catalyst," as used herein, refers to core-shell nanostructures that have catalytic activity, such as for oxygen reduction reaction (ORR).

"Nano-substrate," or "seeds," are used interchangeably and herein refer to a nano-scale metal object, typically formed of palladium.

"Core-shell nanostructure," as used herein, refers to a nano-scale core-shell particle formed of a metallic core, typically palladium, having one or more shells or overlayers of another metal, typically platinum. The core-shell nanostructures can also be considered core-shell nanoparticles.

"Electrocatalyst," as used herein, refers to a catalyst that participates in an electrochemical reaction. Such catalyst materials modify and increase the rate of chemical reactions without being consumed in the process.

"Electrochemically active surface area (ECSA)" of the catalyst, as used herein, refers to the surface area of the catalyst which contacts the electrolyte and participates in electrochemical reactions.

"Overlayers," as used herein, refers to about one or more atomic layers of metal atoms which occupy the available surface sites and cover the exposed surface of a substrate. When more than one layer is present on the surface, each layer is epitaxially deposited layer-by-layer on top of a preceding layer. When the surface coverage does not fully cover the substrate surface the overlayer is considered to be a submonolayer.

"Perfect," as used herein, refers to a nano-substrate or core-shell nano-structure wherein the tips, vertices, edges, and/or corners are sharp.

"Truncated," as used herein, refers to a nano-substrate or core-shell nano-structure wherein the tips, vertices, corners, and/or edges show any degree of truncation.

II. Methods of Making Core-Shell Nanostructures

A. Preparation of Palladium Nano-Substrates

Palladium nano-substrates (seeds) can be produced by conventional methods known in the art. Palladium nano-substrates are used as seeds onto which epitaxial layer-by-layer deposition of zero-valent platinum overlayers is applied.

In one embodiment, nano-substrates (seeds) are prepared by contacting a palladium-containing compound with a reducing agent in a suitable solvent Exemplary palladium-containing compounds include, but are not limited to, palladium(II) chloride, palladium(II) bromide, palladium(II) iodide, palladium(II) nitrate, sodium tetrachloropalladate (II), potassium tetrachloropalladate(II), potassium hexachloropalladate(IV), ammonium tetrachloropalladate(II), ammonium hexachloropalladatea(IV), palladium(II) acetate, palladium(II) acetylacetonate, palladium(II) hexafluoreacetylacetonate, palladium(II) trifluoroacetate, tetraamminepalladium(II) acetate, tetraamminepalladium(II) nitrate, tetraamminepalladium(II) sulfate, tetraamminenalladium(II) dichloride, bis(acetonitrile) dichloropalladium(II), and bis(benzonitrile)palladium(II) chloride. In one preferred embodiment, the palladium-containing compound is sodium tetrachloropalladate(II).

Typically, the palladium-containing compound is dissolved in a suitable solvent to form a solution which is added to a separate solution containing the reducing agent, in some embodiments, the molar concentration of the palladium-containing compound solution prepared is in the range of about 0.1 to about 1000 mmol $L^{-1}$, more preferably about 1.0 to about 100 mmol $L^{-1}$. Those skilled in the art will appreciate that the molar concentration of the palladium-containing compound solution can be adjusted to any concentration needed for the purposes of scaling up the synthesis.

Exemplary reducing agents include, but are not limited to L-ascorbic acid, citric acid, formaldehyde, formic acid, poly(vinyl pyrrolidone), sodium citrate, glucose, ethylene glycol, diethylene glycol, triethylene glycol, tetraethylene glycol, and polyethylene glycol. The molar ratio of reducing agent added in relation to the amount of palladium-containing compound is as least about 1:1, at least about 1.2:1, at least about 1.3:1 or at least about 1.5:1. In one preferred embodiment, the reducing agent is L-ascorbic acid and the palladium-containing compound is sodium tetrachloropalladate(II). In another preferred embodiment, the reducing agent is formaldehyde and the palladium-containing compound is sodium tetrachloropalladate(II). In yet another preferred embodiment, the reducing agent diethylene glycol (DEG) and the palladium-containing compound is sodium tetrachloropalladate(II).

In preferred embodiments, one or more colloidal stabilizers, such as poly(vinyl pyrrolidone) (PVP), cetrimonium bromide (CTAB), cetrimonium chloride (CTAC), organic acids and organic amines and poly(diallyldimethylammonium chloride), and/or capping agents, such as bromide ions formed from potassium bromide (KBr), sodium bromide (NaBr) or ammonium bromide ($NH_4Br$) are added during the synthesis of the palladium nano-substrates (seeds) according to the method disclosed herein.

Suitable solvents used to prepare the solutions described above can be chosen from polar or non-polar aqueous or organic solvents. In certain embodiments, the suitable solvent is a polyol-type solvent. Exemplary polyol-type solvents include, but are not limited to ethylene glycol, diethylene glycol, and tetraethylene glycol. In a preferred embodiment the polyol solvent is ethylene glycol (EG) or diethylene glycol (DEG). In other embodiments, the solvent is water, deionized water or a predominantly aqueous solvent. In certain other embodiments the suitable solvent is selected from one or more organic solvents such as organic acids, amines, benzyl alcohol, or dimethylformamide (DMF). The solvent or solvent mixture chosen can be degassed as necessary using any appropriate method known in the an and the reaction is typically carried out under inert atmosphere.

The reaction to form the palladium nano-substrates can be performed at a temperature range from about 20° C. to about 150° C. and the reaction can be carried out for any suitable amount of time required to produce the desired palladium nano-substrates, the period of time being preferably in the range of from about one hour to about 24 hours.

The palladium nano-substrates can be isolated using any appropriate technique known in the art such as, for example, filtration or centrifugation. The isolated palladium nano-substrates can be purified, as needed, by washing any number of times with deionized water, and/or organic solvents. The purified palladium nano-substrates can be re-dispersed in a suitable solvent, such as ethylene glycol or deionized water, and stored prior to deposition of one or more platinum overlayers. Alternatively, the palladium nano-substrates can be dried and stored and subsequently re-dispersed in a suitable solvent (i.e., ethylene glycol or deionized water) prior to deposition of one or more platinum overlayers.

The palladium nanosubstrates produced according to the method described can have a shape chosen from the group consisting of cubic, tetrahedral, bipyramidal, octahedral, icosahedral, decahedral, concave cubic, plate, rod and wire shapes. In certain embodiments the aforementioned nano-substrate shapes are non-truncated (perfect) or they are truncated, having various degrees of truncation at the corners and/or edges. In certain other embodiments, the nano-substrates seeds can be rod (i.e., rectangular, pentagonal, octagonal), bar (i.e., rectangular), wire (i.e., rectangular, octagonal, pentagonal), and plate shaped. The selection of shape and/or degree of truncation can be controlled according to the reaction conditions used.

The average particle size of the palladium nano-substrates (seeds) produced is preferably in the range of about 1 to about 1000 nm, as measured from the edge lengths of the nano-substrates. The size of the palladium nano-substrates (seeds) can be controlled according to the reaction conditions used.

B. Deposition of Platinum Overlayers onto Palladium Nano-Substrates

The palladium nano-substrates discussed above act as seeds onto which one or more epitaxially deposited overlayers of zero-valent platinum are formed to produce platinum on palladium nanostructures, denoted $Pd@Pt_{nL}$, wherein the value of "n" denotes the number of platinum overlayers and "L" is an abbreviation of the term layer(s).

Generally, the palladium nano-substrates as discussed above have a shape selected from cubic, tetrahedral, bipyramidal, octahedral, icosahedral, and decahedral shapes or, alternatively, have a rod (i.e., rectangular, pentagonal, octagonal), bar (i.e., rectangular), wire (i.e., rectangular, octagonal, pentagonal), or plate shape and the selected shape can be perfect (non-truncated) or truncated, having any degree of truncation at the corners and/or edges. Preferred palladium nano-substrates have cubic, octahedral, or icosahedral shapes, which may or may not be truncated. Preferably, the palladium nano-substrate crystals are enclosed by {111} and/or {100} facets and/or have twin defects on the nano-substrate surface.

According to the method described herein, core-shell nanostructures formed of a palladium nano-substrate core conformally coated with one or more overlayers of epitaxially deposited zero-valent platinum atoms are produced by a method including the steps of:

(1) combining a first solution comprising a plurality of palladium nano-substrates and a reducing agent with a second solution comprising a platinum-containing compound; and (2) heating the mixture to induce epitaxial layer-by-layer deposition of one or more platinum overlayers conformally deposited onto the palladium nano-substrates.

Exemplary reducing agents include, but are not limited to L-ascorbic acid, citric acid, formaldehyde, formic acid, poly(vinyl pyrrolidone), sodium citrate, glucose, ethylene glycol, diethylene triethylene glycol, tetracthylene glycol, and polyethylene glycol. The molar ratio of reducing agent added to in relation to amount of platinum-containing compound is as least about 1:1, at least about 1.2:1, at least about 1.3:1 or at least about 1.5:1. In one preferred embodiment, the reducing agent is L-ascorbic acid. In another preferred embodiment, the reducing agent is citric acid.

In certain embodiments, the platinum-containing compound is selected from the group consisting of platinum(II) chloride, platinum(IV) chloride, platinum(II) bromide, chloroplatinic acid, sodium tetrachloroplatinate(II), sodium hexachloroplatinate(IV), potassium tetrachloroplatinate(II), potassium hexachloroplatinate(IV), tetraammineplatinum (II) chloride, tetraammineplatinum(II) nitrate, ammonium tetrachloroplatinate(II), ammonium hexachloroplatinate (IV), platinum(II) acetylacetonate, and hydrates thereof. In some embodiments, the platinum-containing compound is sodium hexachloroplatinate(IV). In another preferred embodiment, the platinum-containing compound is potassium tetrachloroplatinate(II).

Typically, the platinum-containing compound is dissolved to form a separate solution which is added to the solution containing the plurality of palladium nano-substrates and reducing agent. In some embodiments, the molar concentration of the platinum-containing compound solution prepared is in the range of about 0.1 to about 1000 µmol $L^{-1}$, more preferably about 1.0 to about 100 µmol $L^{-1}$. Those skilled in the art will appreciate that the molar concentration of the platinum-containing compound solution can be adjusted to any concentration as needed for purposes of scaling up the synthesis. The concentration of palladium nano-substrates in the first solution prepared is typically in the range of about 0.01 to about 2.0 mg $mL^{-1}$. Those skilled in the art will appreciate that the concentration of the solution containing the palladium nano-substrates can be adjusted to any concentration as needed for the purposes of scaling up the synthesis. The volume of the platinum-containing compound solution added to the solution containing the dispersed palladium nano-substrates and reducing agent can be used as a parameter to control the number of zero-valent platinum overlayers deposited on the palladium nano-substrates. In some embodiments, the platinum-containing second solution is added to the first solution containing the dispersed palladium nano-substrates and reducing agent in its entirety in one single shot addition. In other embodiments, the solution of the platinum-containing compound can be added (injected) to the solution containing the dispersed palladium nano-substrates and reducing agent at a rate selected from the range of about 0.5 to about 100 mL $h^{-1}$, more preferably about 1.0 to about 75 mL $h^{-1}$, and most preferably about 3.0 to about 50 mL $h^{-1}$. In a preferred embodiment, the addition (injection) rate is about 4.0 mL $h^{-1}$. Without wishing to be bound by any theory, by controlling the rate of addition (injection) of the platinum containing solution, the concentration of reduced platinum atoms can be controlled and the concentration kept to a low level which can effectively prevent self-nucleation of the newly generated platinum atoms. The rate of addition (injection) of the platinum-containing solution can be controlled by any means known in the art, such as for example using a syringe pump.

Any of the solutions discussed above can be prepared in a suitable solvent chosen from polar or non-polar aqueous or organic solvents. In certain embodiments, a preferred solvent is a polyol-type solvent. Exemplary polyol-type solvents include, but axe not limited to ethylene glycol, diethylene triethylene glycol, and tetraethylene glycol. In a preferred embodiment the polyol solvent is ethylene glycol. In other embodiments, the preferred solvent water, deionized water, or a predominantly aqueous solvent. In certain other embodiments the suitable solvent is chosen from one or more organic solvents selected from the group consisting of organic acids, amines or benzyl alcohol. The solvent or solvent mixture chosen can be degassed as necessary using any appropriate method known in the art and the platinum deposition process according to the method is typically carried out under inert atmosphere.

In some embodiments, one or more colloidal stabilizers, such as PVP and/or capping agents, such as bromide ions from KBr, NaBr, or $NH_4Br$ are added during the synthesis of the Pd@Pt$_{nL}$ core-shell nanostructures according to the method disclosed herein. In certain embodiments, the one or more colloidal stabilizers, such as PVP and/or capping agents, such as bromide ions from KBr may be excluded from the synthesis according to the method disclosed herein.

The conformal deposition of one or more zero-valent platinum overlayers onto palladium nano-substrates is performed at an elevated temperature in the range from about 75° C. to about 250° C. and is carried out for any suitable period of time required to produce the desired palladium nano-substrates, the period of time preferably in the range of from about one hour to about 24 hours. In some embodiments, the first solution containing the palladium nano-substrates and reducing agent is first pre-heated to a temperature in the range of about 75 to about 250° C. prior to the addition of the solution of the platinum-containing compound.

Without wishing to be bound by any theory, conformal deposition of reduced platinum atoms on the palladium nano-substrates includes an initial deposition of the platinum adatoms at corners of the nano-substrates believed to occur due to chemisorption of bromide ion capping agent on side faces of palladium nano-substrates. Surface deposited platinum adatoms then diffuse from the corners to the edges and side faces of the palladium nano-substrates. As a result, the morphology of the final core-shell nanostructures was largely determined by the difference in rates responsible for platinum atom deposition ($V_{deposition}$) and surface diffusion of the adatoms ($V_{diffusion}$); see FIG. 1. A flat surface could be achieved for the zero-valent platinum overlayers formed on the side face of a palladium nano-substrate (seed) via a combination of slow injection of the platinum-containing compound solution to afford a low $V_{deposition}$ rate and high reaction temperature to afford a high $V_{diffusion}$ rate. High reaction temperatures selected from the above temperature ranges above provide adequate thermochemical energy to overcome (break) the high intrinsic surface free energy and interatomic bond energy (307 kJ mol$^{-1}$) between platinum atoms (i.e., strong Pt—Pt interaction) in order to induce platinum deposition by layer-by-layer epitaxy by promoting surface diffusion of reduced platinum particles being deposited on the palladium nano-substrates surface(s). Thus, when deposition of reduced platinum atoms occurs more slowly than surface diffusion (i.e., $V_{deposition}<V_{diffusion}$), the platinum atoms can evenly spread across the platinum nano-substrate side face to generate a Pd@Pt$_{nL}$ core-shell nanostructure with a well-controlled number of platinum atomic overlayers. In contrast, when the deposition of reduced platinum atoms occurs at a rate faster than surface diffusion (i.e., $V_{deposition}>V_{diffusion}$), the deposition of the platinum atoms can be preferentially induced at the corner sites due to the lower surface diffusion rate. Capping, agents, such as KBr used to generate bromide ions in the reaction solution are important as they lower the surface free energy of the newly deposited platinum facets.

The Pd@Pt$_{nL}$ nanostructures can be isolated using any appropriate technique known in the art such as, for example, filtration or centrifugation. The isolated Pd@Pt$_{nL}$ nanostructures can be purified, as needed, by washing any number of times with water, deionized water, and/or organic solvents. The purified palladium nano-substrates can be re-dispersed in a suitable solvent such as ethylene glycol or deionized water and stored prior to deposition of one or more platinum overlayers. Alternatively, the Pd@Pt$_{nL}$ nanostructures can be dried and stored and subsequently re-dispersed in a suitable solvent (i.e., ethylene glycol or deionized water) prior to deposition of one or more platinum overlayers.

The average size of the Pd@Pt$_{nL}$ core-shell nanostructures produced according to the methods described herein is preferably in the range of about 1 to about 1000 nm, as measured from the edge lengths of the core-shell nanostructures. The size of the Pd@Pt$_{nL}$ core-shell nanostructures can be controlled according to the reaction conditions used.

1. Platinum Overlayer Deposition in Polyol-Based Solvent

According to one embodiment, the deposition of one or more zero-valent platinum overlayers onto palladium nano-substrates can be carried out in a polyol-type solvent, such as ethylene glycol (EG), and the reaction solution is preferably heated to a temperature in the range of about 150 to about 250° C., more preferably about 175 to about 225° C., and most preferably 190 to about 210° C. In a preferred embodiment, the deposition of zero-valent platinum overlayers in a polyol solvent is carried out at about 200° C.

In some embodiments, the weight percentage of platinum in the Pd@Pt$_{nL}$ nanostructures is from about 1% to about 50%, from about 10% to about 45%, from about 20% to about 35%, depending on the number of zero-valent platinum overlayers.

2. Platinum Overlayer Deposition in an Water-Based Solvent

Figure 2:
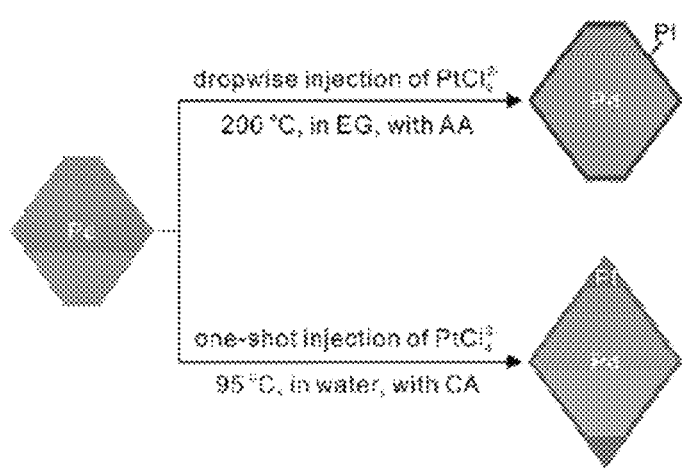
FIG. 2 shows a schematic diagram of the syntheses of Pd@Pt$_{nL}$ octahedra via two different routes involving polyol and water, respectively. For the synthesis in a polyol-based solvent (such as ethylene glycol (EG)), a solution of PtCl$_6^{2-}$ is added dropwise into the reaction solution containing L-ascorbic acid (AA) at 200° C. Due to the use of a relatively high temperature, the core-shell octahedra produced have slight/minor truncation at the corners, just like the starting Pd nano-substrates (seeds). For the synthesis in a water-based solvent, an aqueous solution of PtCl$_4^{2-}$ is added in one shot into the reaction solution containing citric acid (CA) at 95° C. The use of a considerably lower reaction temperature results in the formation of core-shell octahedra with sharper corners.

According to another embodiment, the deposition of one or more zero-valent platinum overlayers onto palladium nano-substrates is carried out in an solvent, such as deionized water, and the reaction solution is preferably heated to a temperature in the range of about 75 to about 100° C., more preferably about 90 to about 95° C. In a preferred embodiment, the deposition of zero-valent platinum overlayers in an aqueous solvent is carried at about 95° C. in the case of aqueous-based synthesis of Pd@Pt$_{nL}$ core-shell nanostructures, sharpening of corners for the core-shell nanostructures may occur due to the use of the lower temperature employed, relative to the synthesis of such nanostructures at higher temperatures, such as in the polyol-based solvent system; see FIG. 2.

To preclude/inhibit self-nucleation of platinum atoms at the relatively lower reaction temperature range of about 100° C., a mild reducing agent, such as citric acid was preferentially used. The use of a mild reducing agent can result in a low concentration of free reduced platinum atoms in the reaction solution which suppresses self-nucleation. Moreover, the use of a mild reducing agent permits the addition of the (precursor) solution of a platinum-containing compound as one single shot. One of ordinary skill in the art would be able to readily select a suitable reducing agent which has mild reducing properties.

In preferred embodiments, no capping agents, such as potassium bromide (KBr) are added during the synthesis of the Pd@Pt$_{nL}$ core-shell nanostructures in an aqueous solvent.

In some embodiments, the weight percentage of platinum in the Pd@Pt$_{nL}$ nanostructures is from about 1% to about 50%, from about 10% to about 45%, from about 20% to about 35% depending on the number of zero-valent platinum overlayers deposited.

III. Pd@Pt$_{nL}$ Core-Shell Nanostructures

The Pd@Pt$_{nL}$ core-shell nanostructures synthesized according the methods described herein are formed from a palladium nano-substrate core which is conformally coated with one or more atomic overlayers of epitaxially deposited zero-valent platinum atoms.

The Pd@Pt$_{nL}$ core-shell nanostructures typically adopt the shape of the palladium nano-substrate (seed) on to which the one or more zero-valent overlayers were deposited onto. The Pd@Pt$_{nL}$ core-shell nanostructures may have a shape selected from cubic, concave cubic, tetrahedral, bipyramidal, octahedral, icosahedral, decahedral, rod, bar, wire, and plate shapes. The produced Pd@Pt$_{nL}$ core-shell nanostructures can have a perfect shape or have corners and/or edges which show any degree of truncation. In some embodiments, the reaction conditions can affect the sharpness of the corners of the Pd@Pt$_{nL}$ core-shell nanostructures produced; see FIG. 2. For example, in an aqueous solvent system using a mild reducing agent at a temperature of about 95° C., it was found that deposition of platinum overlayers resulted in sharp corners. In some embodiments, the above-described shapes of the Pd@Pt$_{nL}$ core-shell nanostructures are concave in nature.

In preferred embodiments, the Pd@Pt$_{nL}$ core-shell nanostructures produced have about one to about ten atomic overlayers of zero-valent platinum deposited onto them typically via epitaxial layer-by-layer growth. The one or more zero-valent platinum overlayers formed are uniformly deposited and can form smooth surfaces on the coated palladium nano-substrates (seeds). In certain embodiments, the entire surface of the nano-substrate covered by a continuous and uniform shell of the one or more platinum overlayers deposited.

In some embodiments, the palladium nano-substrate crystal has {100}, {111} facets and/or twin defects on its surface such that the one or more zero-valent platinum overlayers formed on the palladium nano-substrate generate a corrugated surface morphology. Without wishing to be bound by any theory, when lateral relaxation on the {111} facet of the palladium nano-substrate is constrained by twin boundaries, the platinum adatoms can only relax along a direction normal to the palladium nano-substrate surface thereby generating a corrugated overlayer(s) on the core-shell nanostructure.

The Pd@Pt$_{nL}$ core-shell nanostructures can have an average particle size in the range of about one to about 1000 nm, more preferably about one to about 100 nm. The platinum-coated particles can be approximately, or precisely, monodisperse in size. Alternatively, the particles can be anywhere from slightly to widely polydisperse in size.

The Pd@Pt$_{nL}$ core-shell nanostructures can have a weight percentage of platinum from about 1% to about 50%, from about 10% to about 45%, from about 20% to about 35%, depending on the number of zero-valent platinum overlayers deposited.

IV. Electrocatalytic Applications Using Pd@Pt$_{nL}$ Nanostructures

In certain embodiments, the Pd@Pt$_{nL}$ core-shell nanostructures described herein are used as electrocatalysts for oxygen reduction reaction (ORR). In certain other embodiments, the Pd@Pt$_{nL}$ core-shell nanostructures described herein can be used as electrocatalysts for hydrogen oxidation reaction (HOR). For example, the Pd@Pt$_{nL}$ core-shell nanostructures can be used in fuel cell applications, such as in a proton-exchange membrane fuel cell (PEMFC), wherein the following reactions occur at the respective electrodes:

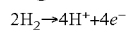   Hydrogen Oxidation Reaction (at anode):

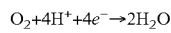   Oxygen Reduction Reaction (at cathode):

The Pd@Pt$_{nL}$ core-shell nanostructures described herein can be incorporated into an electrode of a fuel cell, such as a proton exchange membrane fuel cell (PEMFC), to improve the performance of the fuel cell. The Pd@Pt$_{nL}$ core-shell nanostructures, when used as electrocatalysts for oxygen reduction reaction (ORR) and/or hydrogen oxidation reaction (HOR), can produce notable enhancements in specific and mass activities, as compared to a commercial PVC catalyst.

Generally, a fuel cell will include a first electrode, a second electrode, an electrolyte between the first electrode and the second electrode, and a proton exchange membrane between the electrodes. In some embodiments, a first electrode contains the Pd@Pt$_{nL}$ core-shell nanostructures. In certain embodiments, both the first and second electrodes may contain the Pd@Pt$_{nL}$ core-shell nanostructures. The skilled artisan may construct PEM fuel cells and select components of the fuel cells, such as electrolytes and membranes based on knowledge available in the art.

The Pd@Pt$_{nL}$ core-shell nanostructures as described herein can be loaded on to an electrically conductive support to form an (electro)catalyst composition according to any suitable method known. In preferred embodiments, the electrically conductive support is carbon-based. Exemplary carbon-based electrically conductive supports include carbon, graphite, carbon nanotubes, carbon nanofibers, mesoporous carbon, graphene, Vulcan™ XC72, XC72R, BP2000, acetylene black, and Ketjen black, in some embodiments, the loading of the Pd@Pt$_{nL}$ core-shell nanostructures onto the conductive support is in the range of about 0.5 to about 30 weight percent, more preferably about 1.0 to about 20 weight percent.

The electrocatalyst prepared can be incorporated into an oxygen-reducing cathode of a fuel cell by any method known in the art. For example, the electrocatalyst can be incorporated by coating an electrode (i.e., glassy carbon electrode) with the electrocatalyst in a suitable binder and incorporating the coated electrode as an oxygen-reducing cathode in the fuel cell. The binder can be, for example, tetrafluoroethylene-based or perfluorinated vinyl ethers such as NAFION®. The binder can be a proton-conducting material which is derivatized with acidic groups, such as sulfonic, carboxylic, phosphinic, or boric acid groups.

The electrochemically active surface area (ECSA) of the Pd@Pt$_{nL}$ core-shell nanostructures on a conductive support electrocatalysts can be derived from the charges responsible for H$_{upd}$ desorption between a given potential range and normalized to the platinum mass. In one embodiment, ECSA is calculated by measuring the charges ($Q_H$) generated from the desorption of hydrogen between 0.08 and 0.45 V (vs. RHE) with a reference value (210 µC cm$^{-2}$ or 240 µC cm$^{-2}$, dependent on the facets of catalysts) for the desorption of a monolayer of hydrogen from a platinum surface and then dividing by the mass of platinum loaded on the working electrode. Details on the methods for determining specific ECSA are known in the art. The specific ECSA of the Pd@Pt$_{nL}$ core-shell nanostructures is preferably at least about 10 m$^2$ per gram of platinum in the core-shell nanostructure. In some embodiments, the specific ECSA of the nanostructures is the range of from about 15 to 125 m$^2$ per gram of platinum in the core-shell nanostructures.

The mass activity at given potential at room temperature (vs. RHE) for the Pd@Pt$_{nL}$ core-shell nanostructure on a conductive support electrocatalysts is preferably at least about 0.1 A per mg of platinum. In other embodiments, the mass activity is in the range of 0.1 to about 1.0 A mg$^{-1}_{Pt}$. In some embodiments, the mass activity at 0.9 V (vs. RHE) is the range from about 0.1 to about 1.0 A mg$^{-1}_{Pt}$.

In some embodiments, the Pd@Pt$_{nL}$ core-shell nanostructures on a conductive support have improved long-term stability, as compared to state-of-the-art commercial Pt/C catalysts, when used as electrocatalysts in a fuel cell operating at or near room temperature or significantly above room temperature (i.e., greater than 50° C.).

EXAMPLES

Materials and General Methods:

Ethylene glycol (EG, 99%) was purchased from J. T. Baker. Sodium palladium (II) tetrachloride (Na$_2$PdCl$_4$, 99.998%) sodium hexachloro platinate(IV) hexahydrate (Na$_2$PtCl$_6$.6H$_2$O, 98%), potassium tetrachloroplatinate(II) (K$_2$PtCl$_4$, 99.99%), poly(vinyl pyrrolidone) (PVP, M$_w$≈55,000), formaldehyde (Fisher Scientific), L-ascorbic acid (99%), citric acid (99.5%), potassium bromide (KBr, 99%), diethylene glycol (DEG), ethanol, isopropanol, and Nation® (5% solution) were all purchased from Sigma-Aldrich and used as received. All aqueous solutions were prepared using deionized (DI) water with a resistivity of 18.2 MΩ·cm.

Structural and Compositional Analyses:

Transmission electron microscopy (TEM) images were taken using a JEM-1400 microscope (JEOL, Tokyo, Japan) or HT7700 microscope (Hitachi) operated at 120 kV by drop casting the core-shell nanostructures dispersions on carbon-coated Cu grids and drying under ambient conditions. High-angle annular dark-field scanning transmission electron microscopy (HAADF-STEM) and energy dispersive X-ray (EDX) analyses were performed using a JEOL ARM200F microscope with STEM Cs corrector operated at 200 kV or on an aberration-corrected FEI TitanS 80-300 TEM/STEM operated at 300 kV, with a probe convergence angle of 30 mrad and a large inner collection angle of 65 mrad and a JEOL JEM 2200FS STEM/TEM microscope equipped with a CEOS probe corrector (Heidelberg, Germany).

Quantitative analysis of metal content composition of the platinum-palladium nanostructures was determined by inductively coupled plasma mass spectrometry (ICP-MS; NexION 300Q, Perkin Elmer).

Preparation of Palladium Nano-Substrates (Seeds):

Pd nanocube seeds with an average edge length of 18 nm were synthesized according to a previously reported protocol (Sin, M. et al. *Nano Res.* 2011, 83-91). In a typical synthesis, PVP (105 mg), L-ascorbic acid (60 mg), KBr (600 mg), and 8.0 mL of deionized water (18.2 MΩ·cm) were mixed in a 25 mL vial and pre-heated at 80° C. for 10 min in an oil bath under magnetic stirring. Na$_2$PdCl$_4$ (57 mg) was separately dissolved in DI water (3 mL) and then added into the pre-heated solution. The reaction vial was capped and maintained at 80° C. for an additional 3 hours. The final product was collected by centrifugation, washed (3×) with DI water, and subsequently re-dispersed in EG (11 mL).

Pd nano-octahedra seeds of 15 and 19 am in edge length were synthesized according to a previously reported protocol (Jin, M. et al. *Energy Environ. Sci.* 2012, 5, 6352-6357) from Pd cubes of 6 and 10 nm in edge length, respectively, the cubes having been prepared according to a previously reported protocol (Jin, M. et al. *Nano Res.* 2011, 4, 83-91). Briefly, for the synthesis of Pd octahedra, a suspension of the Pd nanocubes (0.3 mL, 1.8 mg mL$^{-1}$), and formaldehyde (0.1 mL) were added into an aqueous solution (8 mL) containing PVP (105 mg) and the mixture was heated at 60° C. for 10 min under magnetic stirring. An aqueous solution (3 mL) containing Na$_2$PdCl$_4$ (29 mg) was then quickly added into the pre-heated solution. The reaction solution was kept at 60° C. for 3 hours under magnetic stirring. The reaction solution was subsequently cooled to room temperature. The Pd octahedra products were collected by centrifugation, washed with DI water (2×), and re-dispersed in EU (2 mL) or DI water (10 mL).

Pd nano-icosahedra seeds were synthesized according to a modified reported protocol (Lv, T. et al. *ChemSusChem* 2013, 6, 1923-1930). Briefly, PVP (80 mg) was dissolved in 2.0 ml of DEG in a 20 mL vial and the solution was heated at 130° C. in an oil bath under magnetic stirring for 10 min. Concurrently, Na$_2$PdCl$_4$ (15.5 mg) was dissolved in 1.0 mL DEG and the solution was injected in one shot into the pre-heated solution with a pipette. The vial was capped and heating at 130° C. was continued for 3 h. The product was collected by centrifugation, washed with acetone (1×) and DI water (2×) to remove excess PVP and inorganic ions, and subsequently re-dispersed in 3 mL of EG.

Example 1: Preparation of Pd@Pt$_{nL}$ (N=1-6) Nanocubes

For the synthesis of Pd@Pt$_{nL}$ (n=1-6) nanocubes, 1.0 mL of the 18 nm cubic Pd seed dispersion (1.68 mg/mL, as determined from ICP-MS and TEM measurements), L-ascorbic acid (100 mg), KBr (54 mg), PVP (66.6 mg), and 12 mL of EG were mixed in a 50 mL flask and pre-heated at 110° C. for 1 hour. The reaction temperature was then quickly ramped up to 200° C. within a 10 min period. Subsequently, the deposition of the Pt atomic layers was initiated by injection of a given volume of a Na$_2$PtCl$_6$.6H$_2$O solution in ethylene glycol (0.25 mg mL$^{-1}$) into the pre-heated reaction solution at a relatively slow rate of 4.0 mL h$^{-1}$ (~10.0 µL per droplet). After the injection of a specific amount of the platinum precursor, the reaction solution was kept at 200° C. for another 1 hour. The final Pd@Pt$_{nL}$ nanocubes were collected by centrifugation, washed ethanol (2×) and DI water (3×), and subsequently redispersed in DI water.

Characterization of Pd@Pt$_{nL}$ Nanocubes:

The number of platinum atomic overlayers was controlled as a function of the volume of platinum precursor (i.e., Na$_2$PtCl$_6$.6H$_2$O solution) added to the palladium nanocube seeds. Quantitative analysis of the average number (n) of platinum atomic layers on the Pd@Pt$_{nL}$ nanocubes and weight percent of platinum in the nanocubes was determined using inductively coupled plasma mass spectrometry (ICP-MS) as shown in Table 1 below.

TABLE 1

Pt content of Pd@Pt$_{nL}$ nanocubes.

| Sample | n of Pt atomic layers | Weight percent of Pt calculated from ICP-MS data |
|---|---|---|
| Pd@Pt$_{1L}$ | 1 | 11.6 |
| Pd@Pt$_{2-3L}$ | 2-3 | 23.1 |
| Pd@Pt$_{4L}$ | 4 | 33.9 |
| Pd@Pt$_{6L}$ | 6 | 44.0 |

Figure 3:
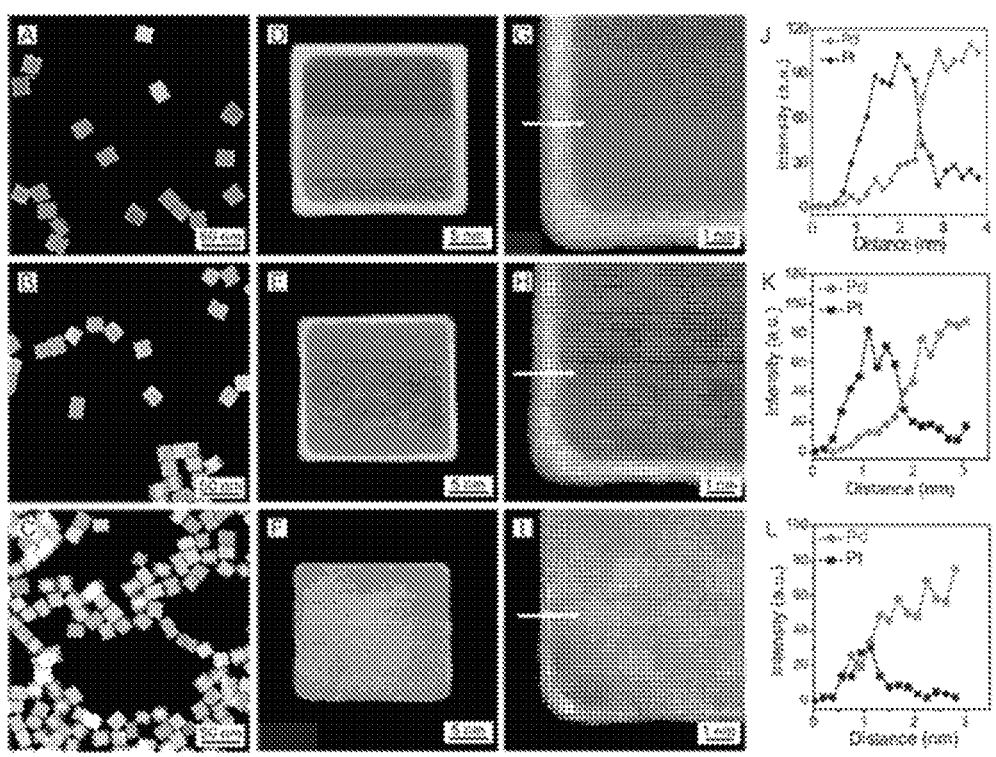
FIG. 3A-L shows TEM images and EDX line scans of Pd@Pt$_{nL}$ (n=1, 4, 6) nanocubes.

HAADF-STEM images of Pd@Pt$_{nL}$ (n=1, 4, and 6) nanocubes are shown in FIG. 3. During the deposition of platinum atomic overlayers, the cubic shape of the palladium substrate seeds was retained, and the overlayers produced were flat and conformal with smooth surfaces as shown, indicating the involvement of epitaxial layer-by-layer growth. The HAADF-STEM imaging showed good contrast between the platinum overlayer shell and the palladium core. The Pd@Pt$_{nL}$ core-shell nanocubes had an average edge length of 19.2 nm, which was 1.2 nm greater than that of the initial palladium nano-cube substrate seeds. On average, the thickness of the platinum shell deposited on each palladium {100} face was around 0.6 nm. Based on the unit cell parameters of platinum, three atomic layers correspond to a thickness of 0.59 nm, which is in good agreement with the value of 0.6 nm measured from the change to average edge length.

Energy-dispersive X-ray spectroscopy (EDX) analysis of the Pd@Pt$_{nL}$ (n=1, 4, and 6) nanocubes taken reveal the elemental compositions of the different nanocubes along the platinum overlayer shell and palladium core as shown in FIG. 3.

Example 2: Preparation of the Pd@Pt$_{nL}$ (N=2-5) Octahedra in a Polyol-Based System For the synthesis of Pd@Pt$_{nL}$ (n=2-5) octahedra, 1.0 mL of the Pd octahedra EG suspension (19 nm in edge length, 0.83 mg mL$^{-1}$), PVP (67 mg), L-ascorbic acid (100 mg), KBr (54 mg), and 12 mL of EG were mixed in a flask and heated at 110° C. for 1 hour under magnetic stirring. The temperature was then quickly ramped up to 200° C. within 20 min and a specific amount of an EG solution containing Na$_2$PtCl$_6$.6H$_2$O (0.1 mg mL$^{-1}$) was added dropwise with a syringe pump at a rate of 4.0 mL h$^{-1}$. After complete injection, the reaction solution was kept at 200° C. for 1 hour under magnetic stirring and subsequently cooled to room temperature. The Pd@Pt$_{nL}$ octahedra were collected by centrifugation, washed with ethanol (2×) and with DI water (3×), and subsequently re-dispersed in DI water.

Characterization of Pd@Pt$_{nL}$ Octahedra(Polyol-Based Protocol):

The number of platinum atomic overlayers was controlled as a function of the volume of platinum precursor (i.e., Na$_2$PtCl$_6$. 6H$_2$O solution) added to the palladium octahedral seeds. Quantitative analysis of the average number (n) of platinum atomic layers on the Pd@Pt$_{nL}$ octahedra and weight percent of platinum in the octahedra was determined using inductively coupled plasma mass spectrometry (ICP-MS) as shown in Table 2 below.

TABLE 2

Pt content of Pd@Pt$_{nL}$ octahedra (polyol-based protocol).

| Sample | n of Pt atomic layers | Weight percent of Pt calculated from ICP-MS data |
|---|---|---|
| Pd@Pt$_{2-3L}$ | 2-3 | 29.1 |
| Pd@Pt$_{3-4L}$ | 3-4 | 36.7 |
| Pd@Pt$_{4-5L}$ | 4-5 | 43.8 |

Figure 4:
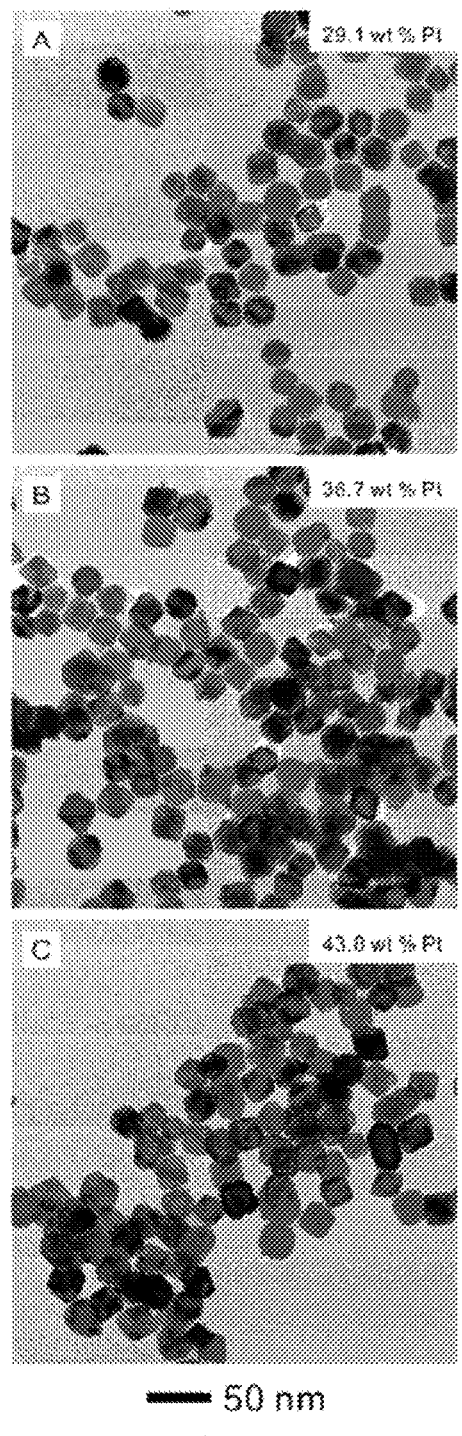
FIGS. 4A-C shows TEM images of Pd@Pt$_{nL}$ octahedra synthesized using the polyol-based protocol.

TEM images of Pd@Pt$_{nL}$ (n=2-5) octahedra are shown in FIGS. 4A-C. During the deposition of platinum atomic overlayers, the octahedral shape of the palladium substrate seeds was retained, and the overlayers produced were flat and conformal with smooth surfaces, indicating the involvement of epitaxial layer-by-layer growth. As shown in FIGS. 5A-E, HAADF-STEM images of the Pd@Pt$_{2-3L}$ core-shell octahedra confirmed that the platinum atoms were uniformly deposited on the surfaces of the palladium substrate seeds largely preserving the truncated corners of the palladium seeds during the deposition of platinum layer.

Figure 5:
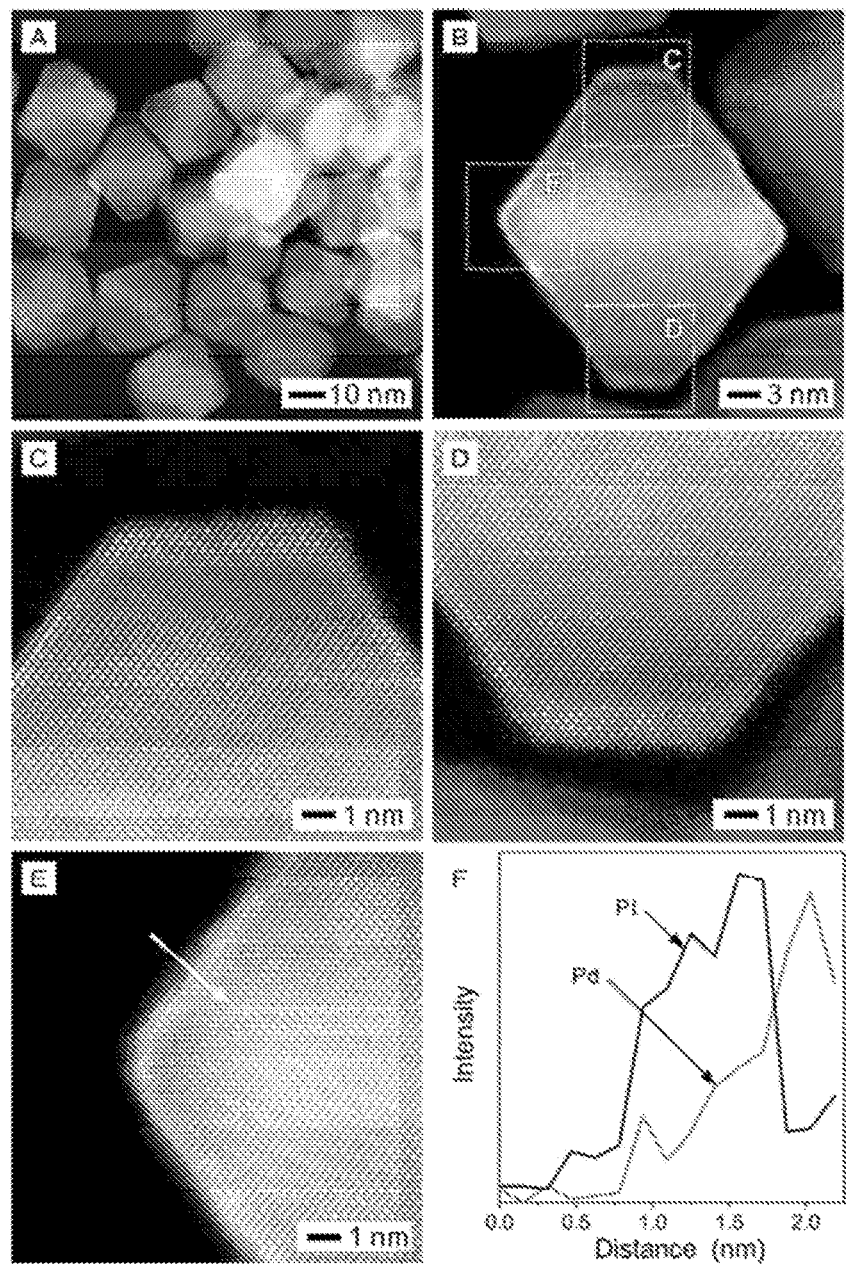
FIGS. 5A-F shows HAADF-STEM images of the Pd@Pt$_{2-3L}$ octahedra synthesized according to the polyol-based protocol and the EDX line scan analysis of the octahedra.

Energy-dispersive X-ray spectroscopy (EDX) analysis of the Pd@Pt$_{2-3L}$ reveal the elemental composition along the platinum overlayer shell and palladium core as shown in FIG. 5F.

Example 3: Preparation of the Pd@Pt$_{nL}$ (N=2-3) Octahedra in a Water-Based Solvent For the synthesis of Pd@Pt$_{nL}$ (n=2-3) octahedra, PVP (35 mg) and citric acid (60 mg) were added into 10 mL of the aqueous suspension of the Pd octahedra (15 nm, 0.19 mg mL$^{-1}$) and then heated at 95° C. for 10 min wider magnetic stirring. Separately, K$_2$PtCl$_4$ (13 mg) was dissolved in 3 mL of DI water and the solution was quickly added into the pre-heated solution using a pipette. The reaction solution was kept at 95° C. for 24 hours under magnetic stirring and subsequently cooled down to room temperature. The Pd@Pt$_{nL}$ (N=2-3) octahedra were collected by centrifugation, washed with DI water (3×), and subsequently re-dispersed in DI water.

Characterization of Pd@Pt$_{nL}$ Octahedra (Water-Based Protocol):

High-angle annular dark-field scanning TEM (HAADF-STEM) images of Pd@Pt$_{2-3L}$ octahedra are shown in FIGS. 6A-E. During the deposition of platinum atomic overlayers, the overlayers produced were uniformly epitaxially deposited and had smooth surfaces. The platinum atoms were evenly deposited on all the side faces of an octahedron-shaped palladium seed, with an average platinum shell thickness of 2-3 atomic overlayers. Pd@Pt$_{2-3L}$ octahedra were found to have sharp corners. This suggested that the decreased reaction temperature in the water-based protocol can slow the rate of diffusion of the platinum adatoms from the palladium seed corners to the side faces.

Quantitative analysis of the average number (n) of platinum atomic layers on the Pd@Pt$_{nL}$ octahedra and weight percent of platinum in the octahedra was determined using inductively coupled plasma mass spectrometry (ICP-MS) as shown in Table 3 below.

TABLE 3

Pt content of Pd@Pt$_{nL}$ octahedra (water-based protocol).

| Sample | n of Pt atomic layers | Weight percent of Pt calculated from ICP-MS data |
|---|---|---|
| Pd@Pt$_{2-3L}$ | 2-3 | 29 |

Figure 6:
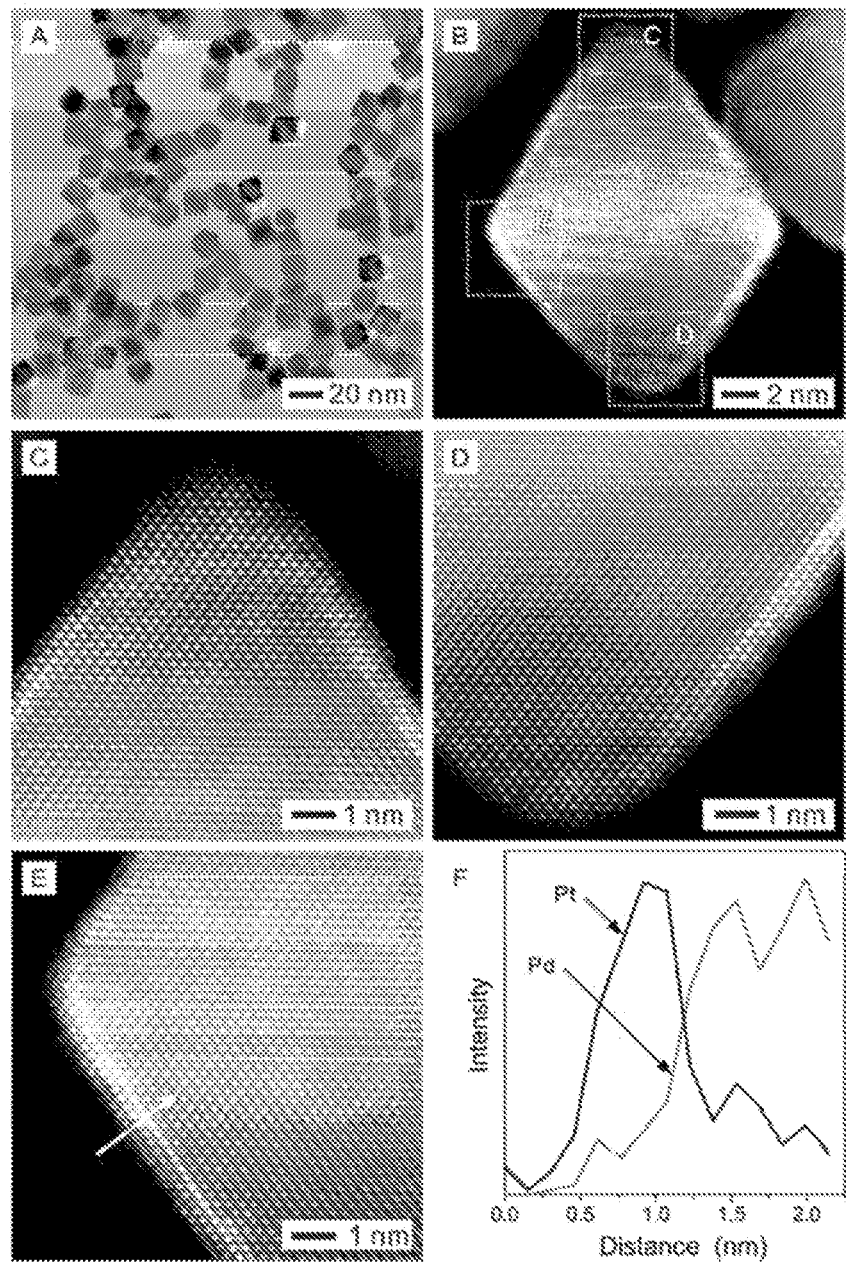
Figure 7:
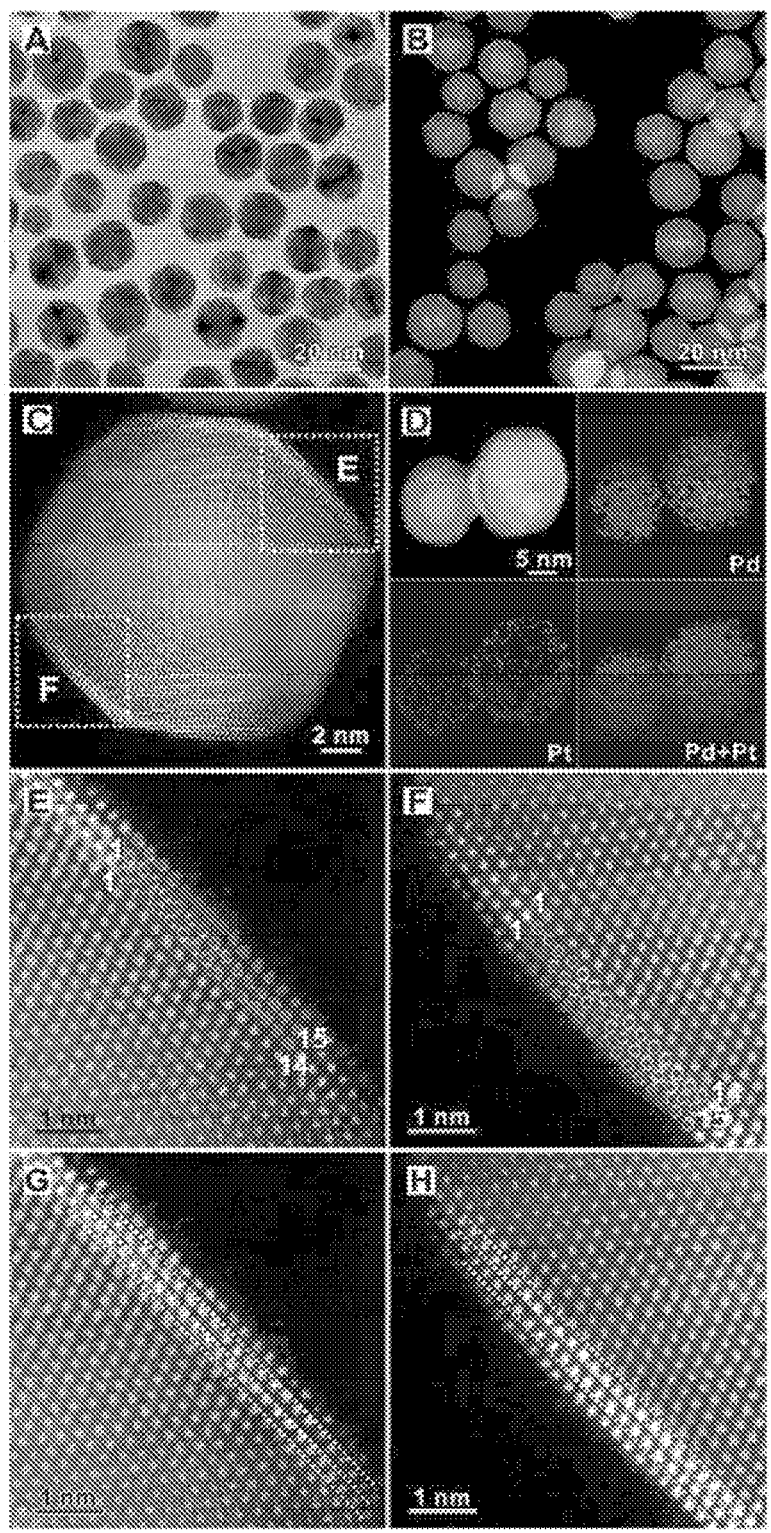
FIGS. 7A-H shows TEM and HAADF-STEM images of Pd@Pt$_{2.7L}$ icosahedra.

Energy-dispersive X-ray spectroscopy (EDX) analysis of the Pd@Pt$_{2-3L}$ octahedra reveal the elemental composition along, the platinum overlayer shell and palladium core as shown in FIG. 6F.

Example 4: Preparation of the Pd@Pt$_{nL}$ (N=0.7-4.3) Icosahedra

For the synthesis of Pd@Pt$_{nL}$ (n=0.7-4.3) icosahedra, 1.0 mL of the Pd icosahedra (0.59 mg mL$^{-1}$, as determined using ICP-MS), KBr (54 mg), PVP (66 mg), L-ascorbic acid (32 mg), and 9 mL of EG were mixed in a 50-mL flask and pre-heated at 1.10° C. for 1 hour. The reaction temperature was then quickly ramped to 200° C. within 10 min. The deposition of Pt atomic layers was initiated by pumping a given volume of a Na$_2$PtCl$_6$.6H$_2$O solution (0.06 mg mL$^{-1}$ in EG) into the reaction solution at a rate of 4.0 mL h$^1$. Corresponding to the samples of Pd@Pt$_{0.7L}$, Pd@Pt$_{2L}$, and Pd@Pt$_{2.7L}$ icosahedra, respectively, 4 mL, 12 mL and 16 mL of the precursor solution was introduced. After the addition of a specific amount of Pt precursor was completed, the reaction solution was kept at 200° C. for another 1 hour. The final Pd@Pt$_{nL}$ icosahedra were collected by centrifugation, washed with acetone (1×) and with ethanol (2×), and subsequently re-dispersed in DI water. A similar procedure for the synthesis of Pd@Pt$_{nL}$ icosahedra was carried out except that 0.5 mL of the Pd icosathedra (0.59 mg mL$^{-1}$) was used and 21 mL of precursor solution (0.04 mg mL$^{-1}$ EG) was pumped into the growth solution at the rate of 4.0 mL h$^{-1}$.

Characterization of Pd@Pt$_{nL}$ Icosahedra:

TEM and HAADF-STEM images of Pd@Pt$_{2-3L}$ icosahedra are shown in FIGS. 7A-F. The icosahedral shape of the palladium seed was well-preserved during the deposition of platinum atoms. The average diameter of the icosahedral shaped palladium seeds increased from 13.4±3.2 nm to 14.9±23 nm, corresponding to a shell thickness of 0.75 nm. The HAADF-STEM image taken of a Pd@Pt$_{nL}$ icosahedron along one of its 2-fold symmetry axes, confirmed that the platinum atoms were deposited as a conformal, uniform shell on the surface of a palladium icosahedral seed (see FIG. 7C). The well-resolved twin planes indicated that the core-shell nanostructure still had a multiply twinned structure consistent with that of an icosahedron. The HAADF-STEM imaging indicated that the platinum overlayer shell was only three atomic layers in thickness. HAADF-STEM imaging further revealed (see FIGS. 7E & 7F) packing of platinum atoms in the overlayers did not precisely follow the underlying palladium atoms of the core. Instead, the platinum atoms underwent relaxation and took on a corrugated structure (see FIGS. 7G & 7H). The formation of such a corrugated structure was attributed to the existence of both tensile strain and twin boundaries on the surface of the palladium icosahedral seed. An icosahedron consists of twenty tetrahedral subunits, with twenty {111} facets and thirty twin boundaries on its surface. Each {111} facet is laterally confined by three twin boundaries. Lattice expansion allows for extra platinum atoms to be packed into each platinum overlayer relative to the number of palladium atoms present cm the surface of the initial seed. As a result, surface relaxation must be involved during the conformal deposition of a platinum shell onto the palladium icosahedral seed. Since lateral relaxation on the {111} facet is constrained by twin boundaries, the platinum atoms can only relax along a direction normal to the surface, thereby generating a corrugated structure.

Quantitative analysis of the average number (n) of platinum atomic layers on the Pd@Pt$_{nL}$ icosahedra and weight percent of platinum in the icosahedra was determined using inductively coupled plasma mass spectrometry (ICP-MS) as shown in Table 4 below. By reducing the volume of the platinum precursor (i.e., Na$_2$PtCl$_6$.6H$_2$O solution) added while fixing the amount of the palladium icosahedral-shaped seeds, the platinum shell thickness could be readily tuned from multiple layers down to a single or even a sub-atomic layer, as indicated by the ICP-MS data.

TABLE 4

Pt content of Pd@Pt$_{nL}$ icosahedra

| Sample | n of Pt atomic layers | Weight percent of Pt calculated from ICP-MS data |
|---|---|---|
| Pd@Pt$_{0.7L}$ | 0.7 | 11.0 |
| Pd@Pt$_{2L}$ | 2.0 | 27.5 |
| Pd@Pt$_{2.7L}$ | 2.7 | 34.2 |
| Pd@Pt$_{4.3L}$ | 4.3 | 47.0 |

The relative rates for atom deposition (V$_{deposition}$) and surface diffusion (V$_{diffusion}$) affect the deposition of platinum overlayers on the palladium seeds as discussed earlier. In the present example, due to the use of a relatively strong reducing agent like L-ascorbic acid, the platinum(IV) precursor is expected to be reduced immediately upon its introduction into the reaction (growth) solution so that V$_{deposition}$ is largely determined as a function of the injection rate. For an icosahedral-shaped palladium seed, every vertex is the intersection of five twin boundaries. Therefore, the platinum atoms tend to be deposited onto the vertices of a Pd icosahedral seed and the platinum adatoms can then diffuse to the edges and side faces of the palladium substrate. When using a slow injection rate for the platinum precursor (i.e., Na$_2$PtCl$_6$.6H$_2$O solution), the rate of V$_{deposition}$ will be small, while a high reaction temperature (200° C.) will result in a large rate of V$_{diffusion}$ so that the platinum atoms deposited on the vertices can quickly diffuse to the edges and side faces to generate a conformal, uniform shell. The deposition of Pt atoms can follow a layer-by-layer growth mode, leading to the formation of Pd@Pt$_{nL}$ icosahedra with a well-controlled thickness for the shell. The effect of reducing the deposition reaction temperature, for example down to 120° C., causes the surface diffusion of platinum adatoms to decelerate due to a lower rate of V$_{diffusion}$ and most of the deposited platinum atoms preferentially remain at the vertices and edges resulting in the formation of core-shell icosahedra with a concave surface. Increasing the deposition reaction temperature to 140° C., causes the relative surface diffusion to accelerate (increased V$_{diffusion}$) for the deposited platinum atoms so that the extent of concaveness of the core-shell icosahedra becomes less significant.

Example 5: Electrochemical Measurements on Pd@Pt$_{nL}$ Nanocubes

Electrochemical measurements were conducted using a glassy carbon rotating disk electrode (RDE, Pine Research Instrumentation) connected to a CHI 600E Potentiostat (CH Instruments). A leak free Ag/AgCl/NaCl (3M) electrode (BASi) was used as the reference. All potentials were converted to values with reference to a reversible hydrogen electrode (RHE). The counter electrode was a Pt mesh (1×1 cm$^2$) attached to a Pt wire. The electrolyte was 0.1 M HClO$_4$ diluted from a 70% stock solution (Baker, ACS Reagent grade) with DI water.

The working electrode was prepared by loading the Pd@Pt$_{nL}$ nanocubes onto a carbon black support (Ketjen®) with a metal loading content of 20 wt % based on the total mass of Pd and Pt (as checked by ICP-MS measurement). The resulting Pd@Pt$_{nL}$ nanocubes on carbon (Pd@Pt$_{nL/C}$) catalysts were then dispersed in acetic acid (10 mL) and heated at 60° C. for 12 hours to clean the surface of the Pd@Pt$_{nL}$ nanocubes, and then washed with ethanol (2×).

After drying, 6.0 mg of the Pd@Pt$_{nL}$/C catalyst was dispersed in a mixed solvent (2.0 mL of DI water, 2.0 mL of isopropanol, and 80 µL of 5% Nafion®) via ultrasonication for 20 min. The suspension (20 µL) was deposited onto a pre-cleaned glassy carbon rotating disk electrode (RDE) with a geometric area of 0.196 cm$^2$ and dried in an oven preset at 60° C. Controls were prepared from Pt/C catalysts (20 wt % 3.2-nm nanoparticles on Vulcan™ XC-72 carbon support obtained directly from Premetek Co.), the working electrode was prepared using the same procedure except for the exclusion of the heating treatment in acetic acid. Therefore, the loading amount of metal for the Pd@Pt$_{nL}$/C and Pt/C catalysts was 6 µg 30.6 µg/cm$^2$ based on the geometric electrode area).

Cyclic voltammograms (CVs) were measured in a N$_2$-saturated 0.1M aqueous HClO$_4$ electrolyte by cycling between 0.08 and 1.1 V (vs. RHE) at a sweep rate of 0.05 V s$^{-1}$. The electrochemically active surface area (ECSA) was estimated by measuring the charges (Q$_H$) generated from the desorption of hydrogen between 0.08 and 0.45 V (vs. RHE) normalized to the Pt mass.

Oxygen reduction reaction (ORR) testing was carried out in an O$_2$-saturated 0.1 M aqueous HClO$_4$ electrolyte at room temperature with a scan rate of 0.01V s$^{-1}$ and a rotation speed of 1,600 rpm.

The kinetic current density (j$_k$) was derived from the Koutecky-Levich equation as follows:

$$\frac{1}{j} = \frac{1}{j_k} + \frac{1}{j_d}$$

where j is measured current density and j$_d$ is the diffusion-limiting current density.

For accelerated durability testing, CVs and ORR polarization curves were measured after sweeping for 5.000 and 10,000 cycles between 0.6 and 1.1 V (vs. RHE) at a rate of 0.1 V s$^4$ in an O$_2$-saturated 0.1 M aqueous HClO$_4$ solution at room temperature.

Figure 8:
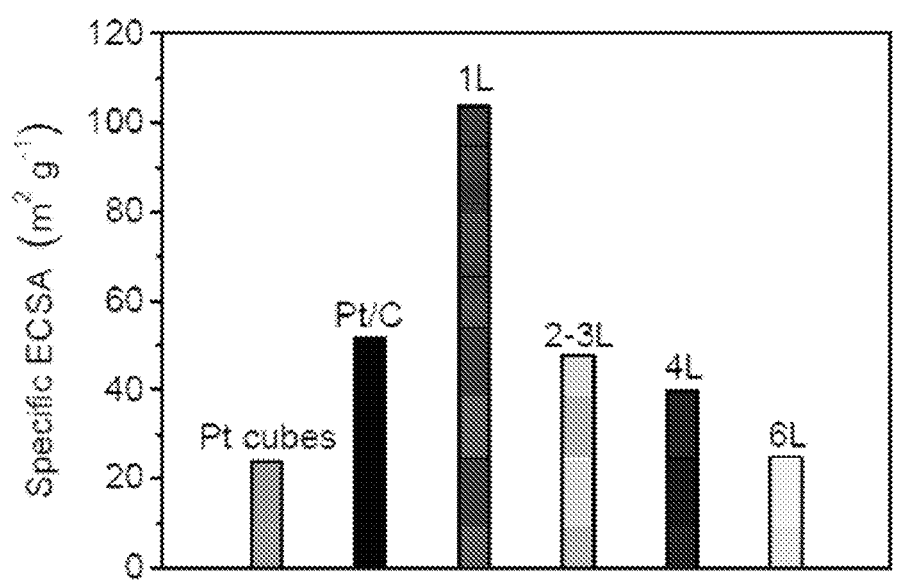
FIG. 8 shows a bar graph of the specific ECSAs for the Pd@Pt$_{nL}$/C (n=1, 2-3, 4, and 6) nanocubes, platinum nanocubes, and commercial Pt/C catalysts as measured from the charges associated with H$_{upd}$ desorption between 0.08 and 0.45 V (vs. RHE).

Results:

The specific electrochemical active surface areas (ECSA) of Pd@Pt$_{1L}$/C (104.1 m$^2$ g$^{-1}$$_{Pt}$) was almost twice that of the control Pt/C catalyst (51.4 m$^2$ g$^{-1}$$_{Pt}$) and four times that of platinum nanocubes (23.9 m$^2$ g$^{-1}$$_{Pt}$) alone. As the average number of platinum atomic overlayers increased, the specific ECSAs were found to gradually drop to 47.6, 39.7, and 24.9 m$^2$ g$^{-1}$$_{Pt}$ for the Pd@Pt$_{2-3L}$/C, Pd@Pt$_{4L}$/C, and Pd@Pt$_{6L}$/C catalysts, respectively (see FIG. 8). The ECSAs of these Pd@Pt$_{nL}$/C (n=1-6) catalysts were all comparable to those of the commercial Pt/C and to platinum nanocubes despite the fact that their average sizes (18-21.2 nm) were much larger than those of Pt/C (3.2 nm) and of the platinum nanocubes (9 nm). The large specific ECSAs associated with the Pd@Pt$_{nL}$/C (n<4) catalysts suggest an increase in utilization efficiency of the platinum atoms when these core-shell nanocubes are used as electrocatalysts.

Figure 9:
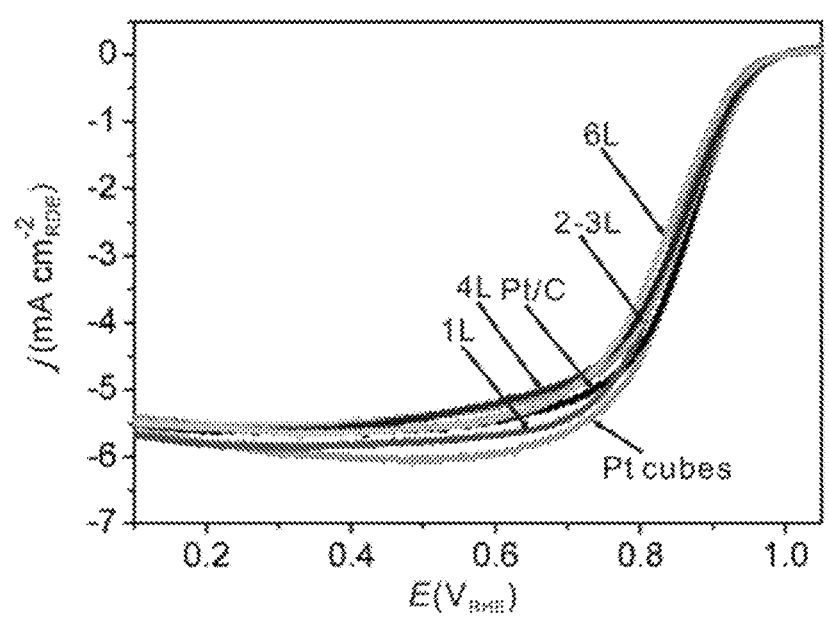
FIG. 9 shows the positive-going ORR polarization curves for the Pd@Pt$_{nL}$/C (n=1, 2-3, 4, and 6) nanocubes, platinum nanocubes, and commercial Pt/C catalysts at room temperature in O$_2$-saturated 0.1 M aqueous HClO$_4$ solutions.
Figure 10:
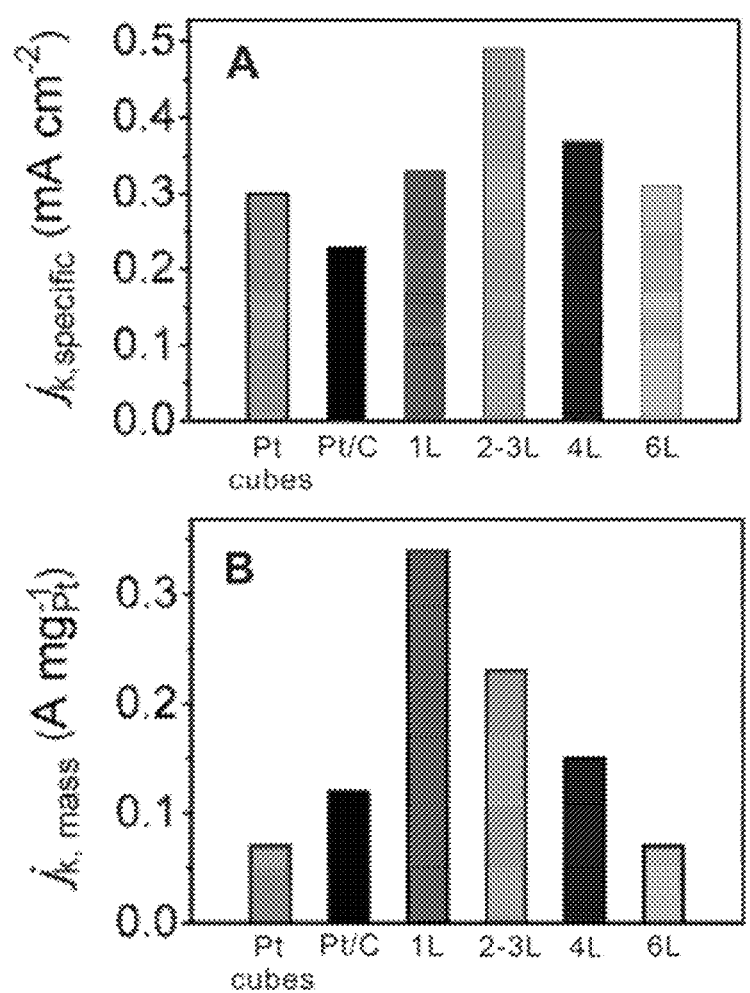
FIGS. 10A-B shows bar graphs of the specific and mass ORR activities given as kinetic current densities (j$_k$) normalized to the ECSA and platinum loading of the Pd@Pt$_{nL}$/C (n=1, 2-3, 4, and 6) nanocubes, platinum nanocubes, and commercial Pt/C catalyst at 0.9 V (vs. RHE), respectively.

The positive-going ORR polarization curves of the Pd@Pt$_{nL}$/C (n=1-6) catalysts are shown in FIG. 9. To better understand the surface and mass effects, we calculated the kinetic currents from the ORR polarization curves according to the Koutecky-Levich equation and then normalized the kinetic current to the ECSA (j$_{k,specific}$) and platinum mass (j$_{k,mass}$), respectively. The specific activities of the Pd@Pt$_{nL}$/C (n≤4) catalysts were all enhanced in the potential region between 0.86 and 0.94 V relative to the state-of-the-art commercial Pt/C catalyst and the Pt nanocubes. As shown in FIG. 10A, at 0.9 V (vs. RHE) the j$_{k,specific}$ values of the four different Pd@Pt$_{nL}$/C (n=1, 2-3, 4, and 6) catalysts were found to show a volcano-shaped dependence based on the number of platinum atomic overlayers with a maximum point corresponding to the Pd@Pt$_{2-3L}$/C catalyst which was 1.6 times that of the platinum nanocubes.

The mass activities of the Pd@Pt$_{nL}$ nanocubes with n=1-4 atomic overlayers of platinum all showed substantially improved mass activities as compared to the state-of-the-art commercial Pt/C catalyst (see FIG. 10B). The overall enhancements in platinum mass activity were attributed to (i) an improvement in the specific activity and (ii) to changes in platinum dispersion. The specific activity follows a volcano trend, which has a maximum at 2-3 platinum atomic overlayers. However, the specific ECSA decreases with each additional layer of platinum atoms. As such, by balancing these two effects, the platinum mass activity can be maximized with only one overlayer of platinum atoms. The mass activity of Pd@Pt$_{1L}$/C at 0.9 V (vs. RHE) was approximately three times higher than that of the commercial Pt/C catalyst.

Figure 11:
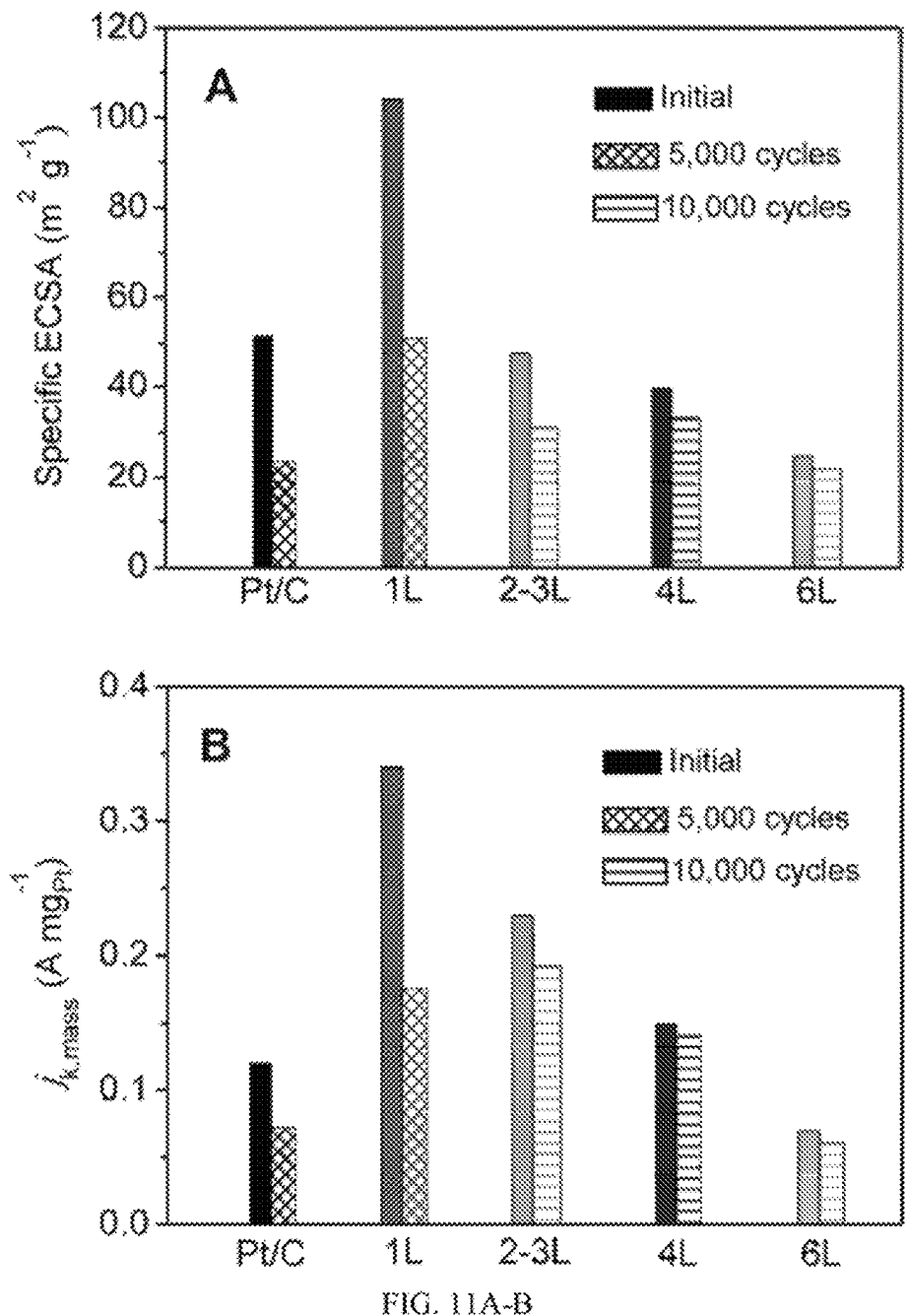
FIGS. 11A-B shows bar graphs of the specific ECSAs and mass activities, given as the kinetic current densities (j$_k$) at 0.9 V (vs. RHE), of the Pd@Pt$_{nL}$/C (n=1, 2-3, 4, and 6) nanocubes and commercial Pt/C ORR catalysts before and after 5.000 and 10,000 cycles of accelerated durability tests.

The long-term stabilities of the Pd@Pt$_{nL}$/C catalysts were evaluated through accelerated durability testing by applying linear potential sweeps between 0.6 and 1.1 at a sweep rate of 0.1 V s$^{-1}$. Compared to the control commercial Pt/C catalyst, the durability was greatly improved in all the Pd@Pt$_{nL}$/C catalysts based on the specific ECSAs and mass ORR activities given as kinetic current densities (j$_k$) at 0.9 V (see FIGS. 11A-B). The specific ECSAs of Pd@Pt$_{2-3L}$/C, Pd@Pt$_{4L}$/C, and Pd@Pt$_{6L}$/C were reduced by 35%, 16%, and 12% after 10,000 cycles. Although the sizes of the Pd@Pt$_{nL}$ nanocubes were all approximately 20 nm, the specific ECSAs after the durability tests were still comparable to or even higher than that of the commercial Pt/C catalyst after 5,000 cycles (FIG. 11A). At 0.9 V, the Pd@Pt$_{4L}$/C only showed a 6% loss in mass activity after 10,000 cycles, while losses for the Pd@Pt$_{1L}$/C and the commercial Pt/C catalysts were 48% and 40% after 5,000 cycles, respectively (FIG. 11B). The increased durability of the catalysts having thicker platinum overlayers can be attributed to improved passivation of the palladium cores by the platinum shells. For both the Pd@Pt$_{1L}$/C and Pd@Pt$_{2-3L}$/C catalysts, most of the palladium cores were dissolved during the durability tests and the remaining platinum atoms were noted to migrate to the corners and edges to generate platinum cubic frames. In contrast, very few of the palladium cores were dissolved during the durability test of the Pd@Pt$_{6L}$/C catalysts. These results suggest a new strategy for generating platinum-based catalysts having excellent performance by depositing zero-valent platinum atoms as conformally deposited and smooth ultrathin shells onto palladium nano-substrates with relatively large sizes (e.g., >10 nm). The mass activity could be retained and even enhanced by dispersing essentially all platinum atoms on the substrate surface.

Example 6: Electrochemical Measurements on Pd@Pt$_{nL}$ Octahedra

Electrochemical measurements were conducted using a glassy carbon rotating disk electrode (RDE, Pine Research Instrumentation) connected to a CHI 600E Potentiostat (CH Instruments). An Ag/AgCl electrode (BAST) and a Pt mesh were used as the reference and counter electrodes, respectively. The potentials (V) were converted, to values with reference to the reversible hydrogen electrode (RHE). The electrolyte was an aqueous HClO$_4$ solution (Baker) with a concentration of 0.1 M.

The Pd@Pt$_{nL}$ octahedra dispersed in water were collected by centrifugation and re-dispersed in 20 mL of ethanol. A specific amount of carbon black (Ketjen®) was added into the suspension to obtain a loading of about 20 wt % based on the total mass of Pt and Pd. The mixture was then ultrasonicated for 3 hours and the resulting Pd@Pt$_{nL}$ octahedra on carbon (Pd@Pt$_{nL}$/C) was collected by centrifugation, re-dispersed in 10 mL of acetic acid, and heated at 60° C. for 2 h to remove PVP on the surface of the particles. The Pd@Pt$_{nL}$/C catalyst was washed with ethanol (3×) and dried in an oven at 70° C. for 30 min.

An Pd@Pt$_{nL}$/C ink was prepared by adding 3 mg of the Pd@Pt$_{nL}$/C into a mixture of DI water (1 mL), isopropanol (1 mL), and Nafion® (5% solution, 40 μL), followed by sonication for 10 min.

The working electrode was prepared by loading the ink (20 μL) onto a glassy carbon electrode. Another working electrode was prepared from the carbon-supported Pt catalyst (Pt/C, 20 wt % 3.2 nm nanoparticles sin Vulcan™ XC-72 carbon support, Premetek) using the same protocol.

Cyclic voltammograms (CVs) were measured in a N$_2$-saturated 0.1M aqueous HClO$_4$ electrolyte by cycling between 0.08 and 1.1 V (vs. RHE) at a sweep rate of 0.05 V s$^{-1}$. The electrochemically active surface area (ECSA) was estimated by measuring the charges (Q$_H$) generated from the desorption of hydrogen between 0.08 and 0.4 V (vs. RHE) with a reference value of 210 μC cm$^{-2}$ for the desorption of a monolayer of hydrogen from a Pt surface and then dividing by the mass of Pt loaded onto the working electrode.

Oxygen reduction reaction (ORR) testing was carried out in an O$_2$-saturated 0.1 M aqueous HClO$_4$ electrolyte at room temperature with a scan rate of 0.01M s$^{-1}$ and a rotation speed of 1,600 rpm.

The kinetic current density (j$_k$) was derived from the Koutecky-Levich equation as shown above.

For accelerated durability testing, CVs and ORR polarization curves were measured after sweeping for 5,000, 10,000, and 20,000 cycles between 0.6 and 1.1 V (vs. RHE) at a rate of 0.1 V s$^{-1}$ in an O$_2$-saturated 0.1 M aqueous HClO$_4$ solution at room temperature.

Figure 12:
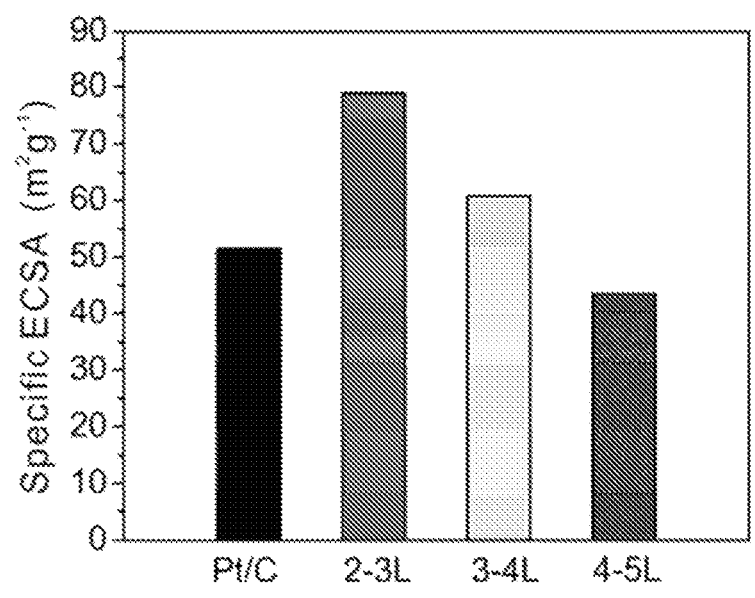
FIG. 12 shows a bar graph of the specific ECSAs for the Pd@Pt$_{nL}$/C (n=2-3, 3-4, and 4-5) octahedra, formed by polyol-based synthesis, and commercial Pt/C catalysts as measured from the charges associated with H$_{upd}$ desorption between 0.08 and 0.4 V (vs. RHE).

Results on Pd@Pt$_{nL}$ Octahedra (Polyol-Based):

m$^2$ g$^{-1}$$_{Pt}$) was approximately one and half times that of the control Pt/C catalyst (51.0 m$^2$ g$^{-}$$_{Pt}$). As the average number of platinum atomic overlayers increased, the specific ECSAs were found to gradually drop to 60.8 and 43.4 m$^2$ g$^{-1}$$_{Pt}$ for the Pd@Pt$_{3-4L}$/C and Pd@Pt$_{4-5L}$/C catalysts, respectively (see FIG. 12). The ECSAs of these Pd@Pt$_{nL}$/C (n=2-5) catalysts were all comparable or even higher as compared to the control Pt/C catalyst, despite the fact that their average sizes (21 nm) were much larger than those of Pt/C (3.2 nm).

Figure 13:
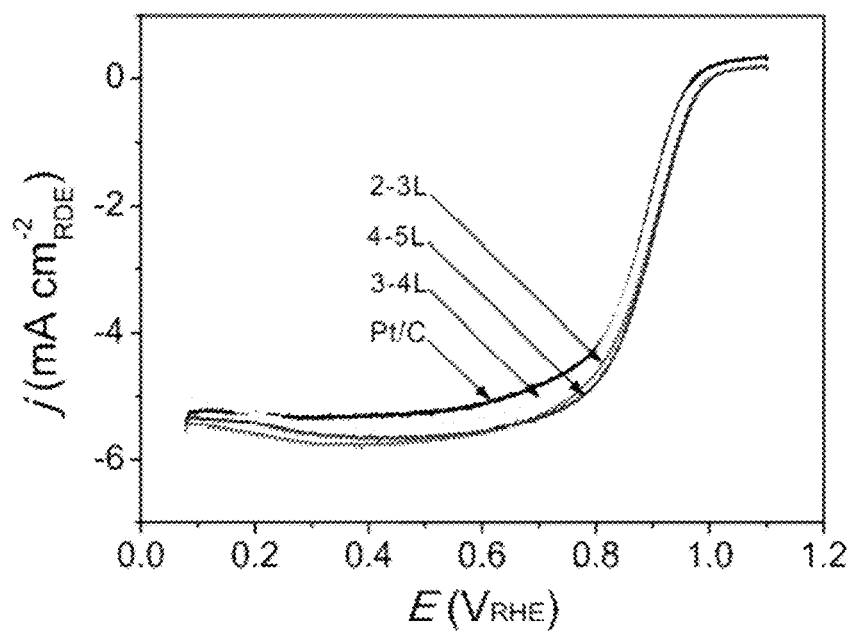
FIG. 13 shows the positive-going ORR polarization curves for the Pd@Pt$_{nL}$/C (n=2-3, 3-4, and 4-5) octahedra and commercial Pt/C catalysts at room temperature in O$_2$-saturated 0.1 M aqueous HClO$_4$ solutions.
Figure 14:
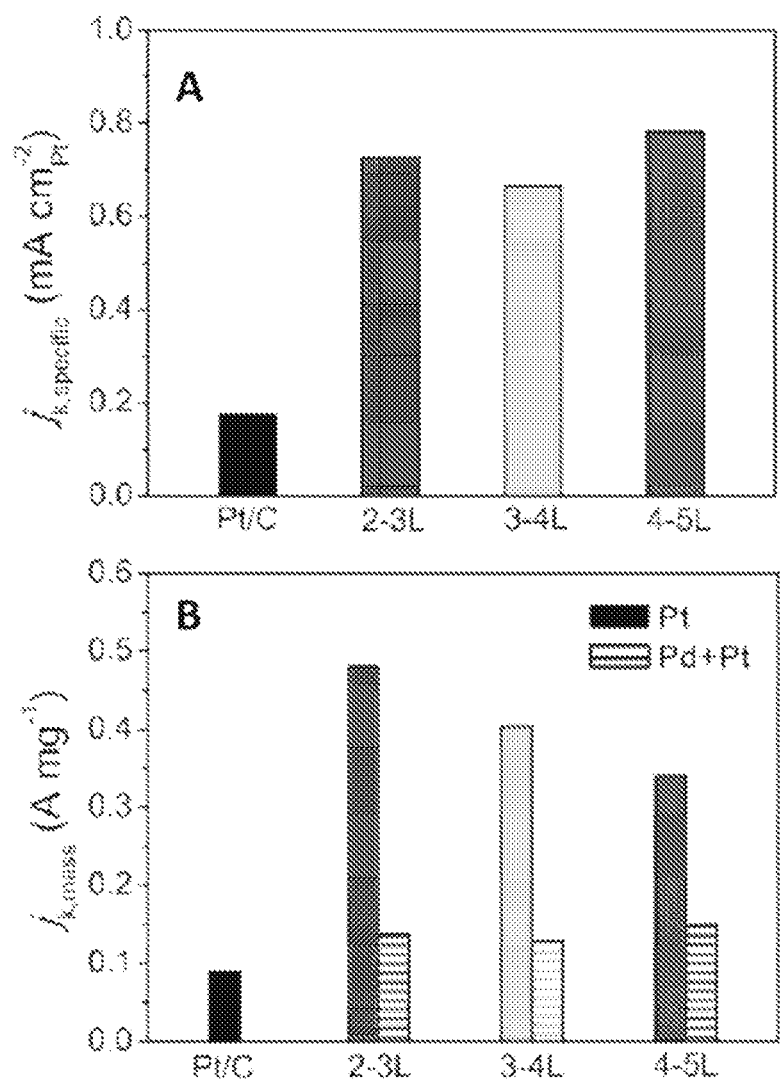
FIGS. 14A-B shows bar graphs of the specific and mass ORR activities given as kinetic current densities (j$_k$) normalized to the ECSA and platinum loading of the Pd@Pt$_{nL}$/C (n=2-3, 3-4, and 4-5) octahedra and commercial Pt/C catalyst at 0.9 V (vs. RHE), respectively.

The positive-going ORR polarization curves of the Pd@Pt$_{nL}$/C (n=1-6) catalysts are shown in FIG. 13. The better understand the surface and mass effects, we calculated the kinetic currents from the ORR polarization curves according to the Koutecky-Levich equation and then normalized the kinetic current to the ECSA (j$_{k,specific}$) and platinum mass (j$_{k,mass}$), respectively. As shown in FIG. 14A, the specific activities of the Pd@Pt$_{nL}$/C catalysts all demonstrated a four-fold enhancement at 0.9 V (vs. RHE) as compared to the state-of-the-art commercial Pt/C catalyst. Such an enhancement in the specific activity was attributed to a combination of the enlargement in proportion of the {111} facets on the surface and the electronic coupling between palladium and platinum.

As shown in FIG. 14B, the mass activities at 0.9 V (vs. RHE) of the Pd@Pt$_{2-3L}$/C, Pd@Pt$_{3-4L}$/C, and Pd@Pt$_{4-5L}$/C based on the mass of platinum were 0.48, 0.40, and 0.34 A mg$^{-1}$$_{Pt}$, respectively, which were 5.4, 4.5, and 3.8 times higher than that of the commercial Pt/C catalyst (0.089 A mg$^{-1}$$_{Pt}$). The significant improvement in the mass activity of the Pd@Pt$_{nL}$/C catalysts was attributed to the enhancement in both specific ORR activity and dispersion of platinum atoms. While the mass activities of the Pd@Pt$_{nL}$/C in terms of platinum content decreased with an increasing number (n) of platinum overlayers, the mass activities in terms of precious metals (i.e., both platinum and palladium) did not change significantly.

Figure 15:
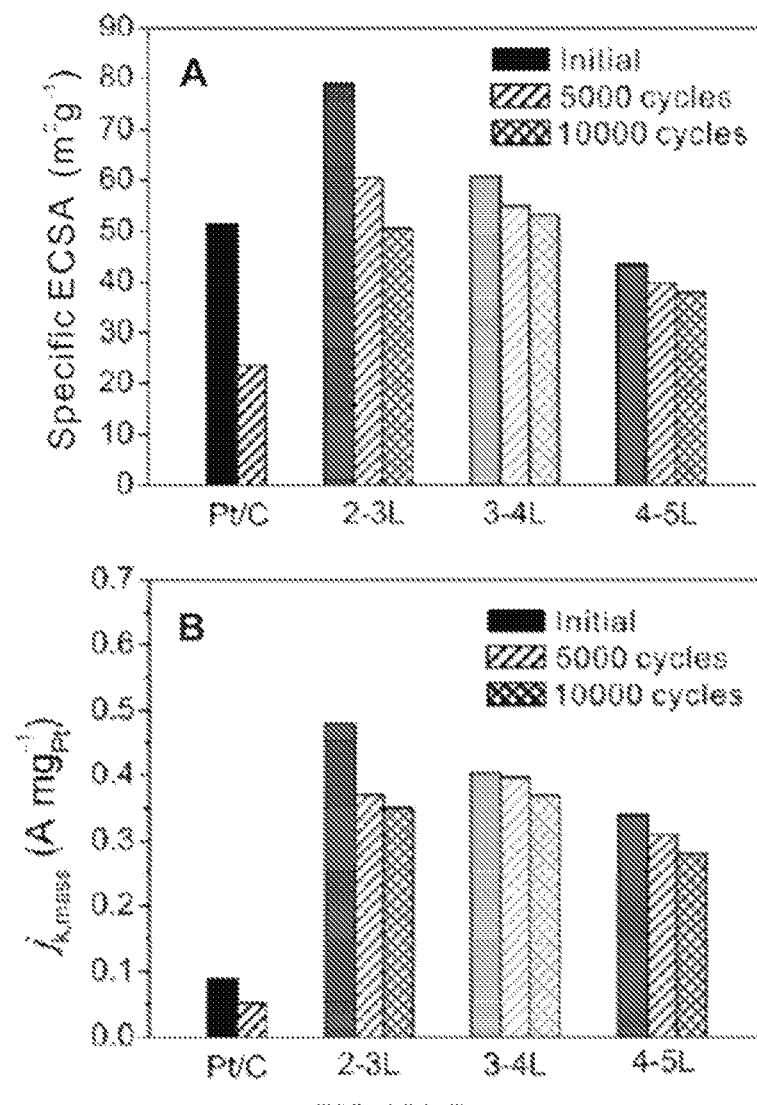
FIGS. 15A-B shows bar graphs of the specific ECSAs and mass activities, given as the kinetic current densities (j$_k$) at 0.9 V (vs. RHE), of the Pd@Pt$_{nL}$/C (n=2-3, 3-4, and 4-5) octahedra and commercial Pt/C ORR catalysts before and after 5,000 and 10,000 cycles of accelerated durability tests.

The long-term stability testing of the Pd@Pt$_{nL}$/C catalysts revealed significantly improved durability as compared to the commercial Pt/C catalyst. At 0.9 V (vs. RHE), the mass activity of Pd@Pt$_{2-3L}$/C, Pd@Pt$_{3-4L}$/C, and Pd@Pt$_{4-5L}$/C decreased by only 28.9%, 8.7%, and 17.6%, respectively, after 10,000 cycles, while the mass activity of the commercial Pt/C catalyst dropped by 54% after only 5,000 cycles (see FIG. 15A). As shown in FIG. 15B, the changes to ORR mass activity during the durability testing corresponded well to the variations in specific surface area. The ECSAs of the Pd@Pt$_{2-3L}$/C, Pd@Pt$_{3-4L}$/C, and Pd@Pt$_{4-5L}$/C catalysts were reduced by 36.0%, 12.3%, and 12.8% after 10,000 cycles. In contrast to the very small particles of the Pt/C, the Pd@Pt$_{nL}$ octahedra could be better protected from dissolution and/or agglomeration during the durability test because of their relatively larger size. The palladium core could also inhibit the corrosion of the platinum shell by sacrificing itself, resulting in an enhancement in durability during ORR.

Figure 16:
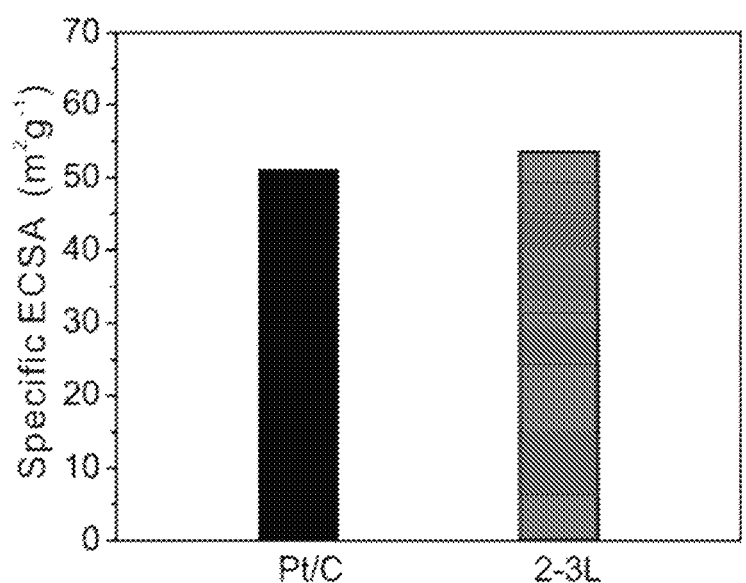
FIG. 16 shows a bar graph of the specific ECSAs for the Pd@Pt$_{2-3L}$/C octahedra, formed by water-based synthesis, and commercial Pt/C catalysts as measured from the charges associated with H$_{upd}$ desorption between 0.08 and 0.4 V (vs. RHE).

Results on Pd@Pt$_{nL}$ Octahedra (Aqueous-Based):

The specific electrochemical active surface areas (ECSA) of Pd@Pt$_{2-3L}$/C (53.6 m$^2$ g$^{-1}$$_{Pt}$) was slightly higher than that of the control Pt/C catalyst (51.0 m$^2$ g$^{-1}$$_{Pt}$) as shown in FIG. 16.

Figure 17:
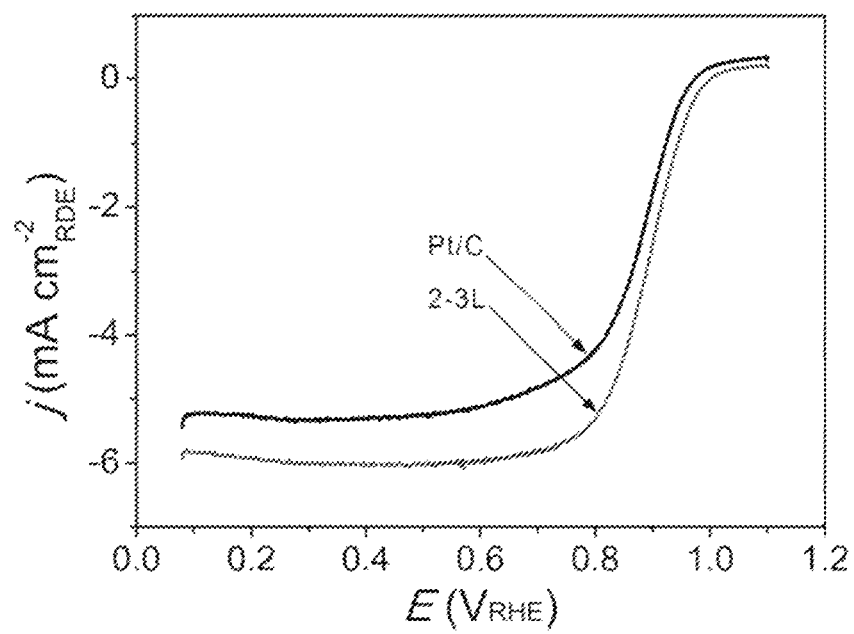
FIG. 17 shows the positive-going ORR polarization curves for the Pd@Pt$_{2-3L}$/C octahedra and commercial Pt/C catalysts at room temperature in O$_2$-saturated 0.1 M aqueous HClO$_4$ solutions.
Figure 18:
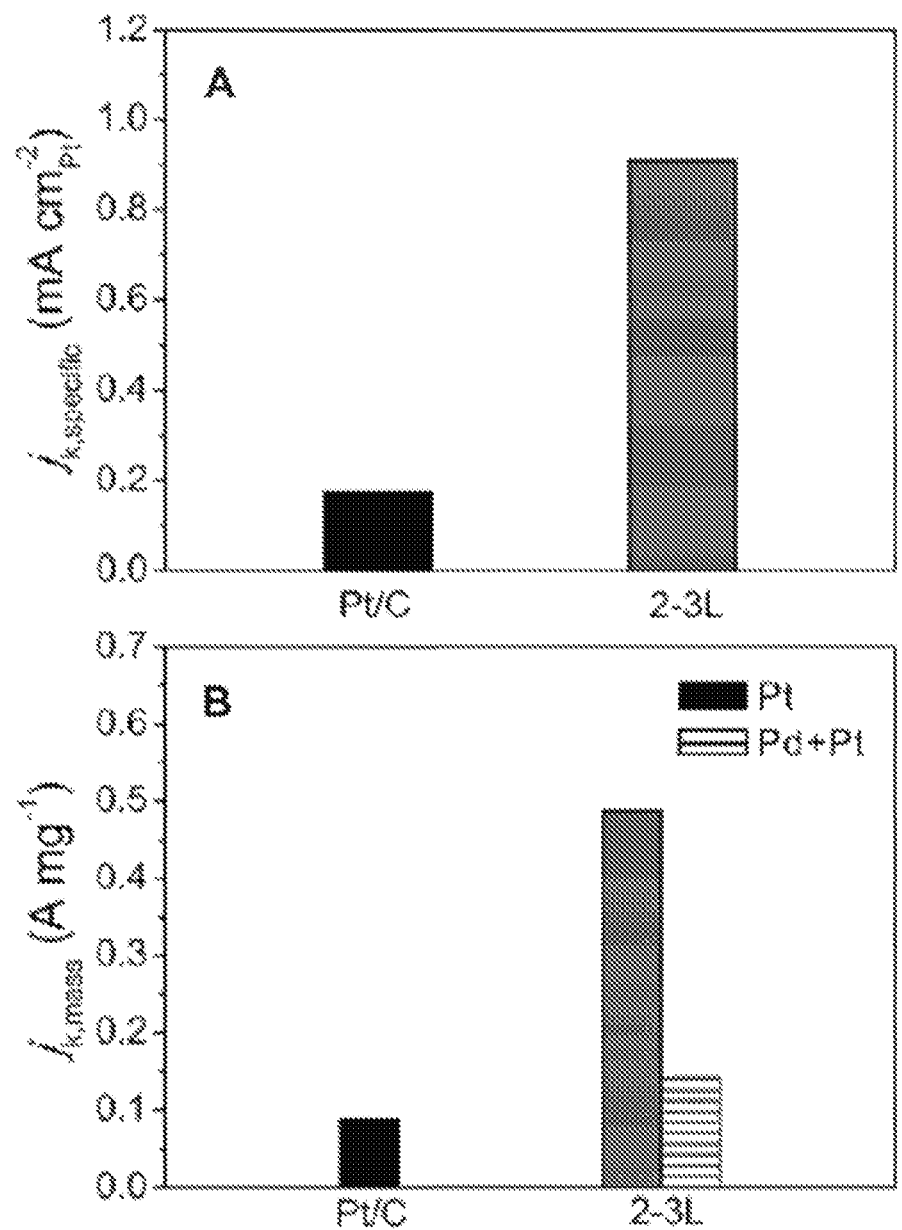
FIGS. 18A-B shows bar graphs of the specific and mass ORR activities given as kinetic current densities (j$_k$) normalized to the ECSAs and platinum loading of the Pd@Pt$_{2-3L}$/C octahedra and commercial Pt/C catalyst at 0.9 V (vs. RHE), respectively.

The positive-going ORR polarization curves of the Pd@Pt$_{2-3L}$/C catalyst is shown in FIG. 17. To better understand the surface and mass effects, we calculated the kinetic currents from the ORR polarization curves according to the Koutecky-Levich equation and then normalized the kinetic current to the ECSA (j$_{k,specific}$) and platinum mass (j$_{k,mass}$), respectively. As shown in FIG. 18 A, the specific activity of the Pd@Pt$_{2-3L}$/C catalyst exhibited a five-fold enhancement at 0.9 V (vs. RHE) compared to the state-of-the-art commercial Pt/C catalyst (0.91 vs. 0.17 mA cm$^{-2}$$_{Pt}$). Interestingly, the specific activity of the Pd@Pt$_{2-3L}$/C catalyst prepared in an aqueous-based system was higher compared as compared to the equivalent Pd@Pt$_{2-3L}$/C prepared in the polyol-based system (0.91 vs. 0.73 mA cm$^{-2}$$_{Pt}$). This difference was attributed to the fact that the nanocrystals synthesized in water were enclosed by well-defined {111} surfaces, while those synthesized in a polyol-based system were enclosed by a mix of {111} and {100} facets due to truncation at the corner sites.

FIG. 18B shows the mass activities at 0.9 V (vs. RHE) of the Pd@Pt$_{2-3L}$/C catalyst based on the mass of platinum was 0.49 A mg$^{-1}$$_{Pt}$, respectively, which was 5.5 times higher than that of the control Pt/C catalyst (0.089 A mg$^{-1}$$_{Pt}$).

Figure 19:
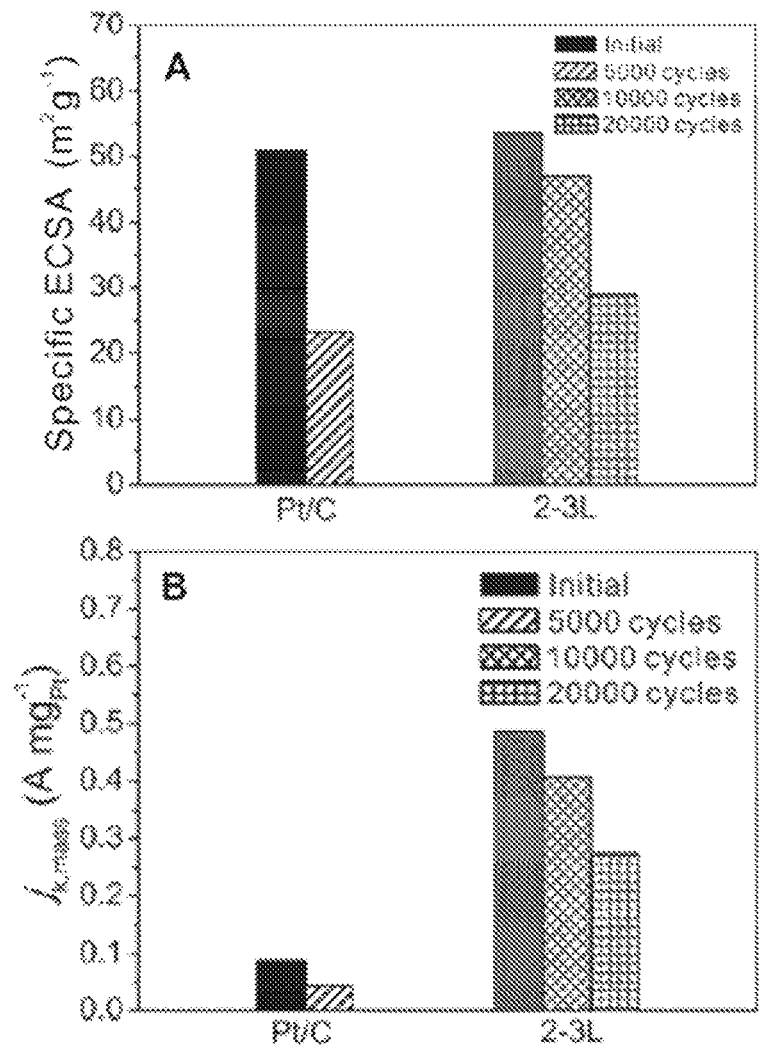
FIGS. 19A-B shows bar graphs of the specific ECSAs and mass activities, given as the kinetic current densities (j$_k$) at 0.9 V (vs. RHE), of the Pd@Pt$_{2-3L}$/C octahedra and commercial Pt/C ORR catalysts before and after 5,000, 10,000 and 20,000 cycles of accelerated durability tests.

The long-term stability of the Pd@Pt$_{2-3L}$/C catalyst showed remarkably improved durability relative to the commercial Pt/C catalyst. The mass activity of the Pd@Pt$_{2-3L}$/C catalyst decreased by only by 13% and 46% after 10,000 and 20,000 cycles, respectively, while the mass activity of the commercial Pt/C catalyst dropped by 54% after only 5,000 cycles (see FIG. 19B). The ECSA of the Pd@Pt$_{2-3L}$/C catalyst showed changes similar to the ORR mass activity during the durability test (see FIG. 19A). The TEM images (not shown) taken from the Pd@Pt$_{2-3L}$/C sample after the accelerated durability test suggested that the Pd cores were sacrificed during the repeated cycles of ORR due to palladium's higher reactivity than platinum.

Example 7 Electrochemical Measurements on Pd@Pt$_{nL}$ Icosahedra

Electrochemical measurements were conducted using a glassy carbon rotating disk electrode (RDE, Pine Research Instrumentation) connected to a CHI 600E Potentiostat (CH Instruments). A leak-free Ag/AgCl/NaCl (3M) electrode (BASi) was used as the reference. All potentials were converted to values with reference to a reversible hydrogen electrode (RHE). The counter electrode was a Pt mesh (1×1 cm$^2$) attached to a Pt wire. The electrolyte was 0.1 M HClO$_4$ diluted from a 70% stock solution (Baker, ACS Reagent grade) with DI water.

The working electrode was prepared by loading the Pd@Pt$_{nL}$ icosahedra onto a carbon black support (Ketjen®) with a metal loading content of 20 wt % based on the total mass of Pd and Pt (as determined by ICP-MS). The resulting Pd@Pt$_{nL}$ icosahedra on carbon (Pd@Pt$_{nL}$/C) were then dispersed in 10 mL of acetic acid and heated at 60° C. for 12 h to clean the surface of the catalytic particles and washed with ethanol (2×). After drying, 3.0 mg of the Pd@Pt$_{nL}$/C catalyst was re-dispersed in a mixture of DI water (1.0 mL), isopropanol (1.0 mL), and Nafion® (5% solution, 40 μL), with ultrasonication for 20 min.

The working electrode was prepared by loading 20 μL of the suspension onto a pre-cleaned glassy carbon rotating disk electrode (RDE, Pine Research instrumentation) with a geometric area of 0.196 cm$^2$ and dried in an oven pre-set to 50° C. For Pt/C catalyst (20 wt %, 3.2-nm Pt particles on Vulcan XC-72 carbon support, Premetek Co.), the working electrode was prepared using similar procedure except for the exclusion of the treatment in acetic acid. The loading amounts of metal were 6 μg or 30.6 μg cm$^{-2}$, respectively, for the Pd@Pt$_{nL}$/C and Pt/C catalysts.

Cyclic voltammograms (CVs) were measured in a N$_2$-saturated 0.1M aqueous HClO$_4$ electrolyte by cycling between 0.08 and 1.1 V (vs. RHE) at a sweep rate of 0.05 V s$^{-1}$. The electrochemically active surface area (ECSA) was estimated by measuring the charges (Q$_H$) generated from the desorption of hydrogen between 0.08 and 0.45 V (vs. RHE) with a reference value of 240 μC cm$^{-2}$ for the desorption of a monolayer of hydrogen from a Pt surface and then dividing by the mass of Pt loaded onto the working electrode.

Oxygen reduction reaction (ORR) testing was carried out in an O$_2$ saturated 0.1 M aqueous HClO$_4$ electrolyte at room temperature with a scan rate of 0.01V s$^{-1}$ and a rotation speed of 1,600 rpm.

The kinetic current density (j$_k$) was derived from the Koutecky-Levich equation as shown above.

For accelerated durability testing, CVs and ORR polarization curves were measured after sweeping for 5,000 and 10,000 cycles between 0.6 and 1.1 V (vs. RHE) at a rate of 0.1 V s$^{-1}$ in an O$_2$-saturated 0.1 M aqueous HClO$_4$ solution at room temperature.

Figure 20:
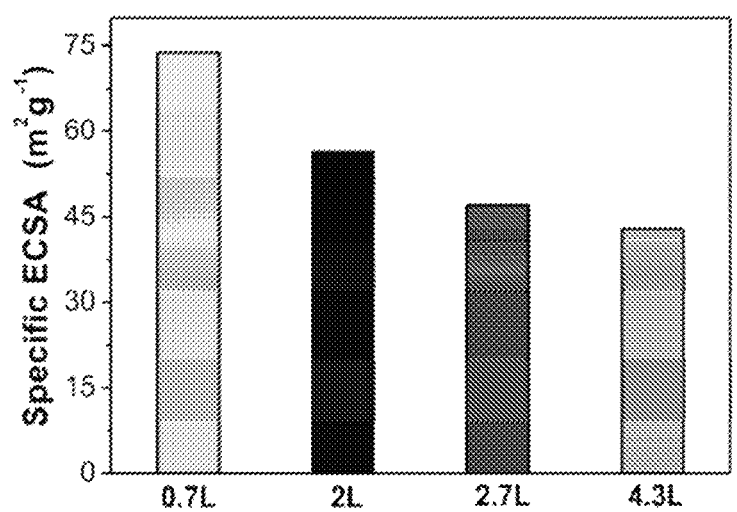
FIG. 20 shows a bar graph of the specific ECSAs for the Pd@Pt$_{2.7L}$/C icosahedra and commercial Pt/C catalysts as measured from the charges associated with H$_{upd}$ desorption between 0.08 and 0.45 V (vs. RHE).

Results:

The specific electrochemical active surface areas (ECSA) of Pd@Pt$_{0.7L}$/C (73.9 m$^2$ g$^{-1}_{Pt}$) was approximately 1.4 times that of the commercial PVC catalyst (51.4 m$^2$ g$^{-1}_{Pt}$). As the average number of platinum atomic overlayers increased, the specific ECSAs were found to gradually drop to 56.3, 47.1, and 42.9 m$^2$ g$^{-1}_{Pt}$ for the Pd@Pt$_{2L}$/C, Pd@Pt$_{2.7L}$/C, and Pd@Pt$_{4.3L}$/C catalysts, respectively. FIG. 20 shows the specific ECSA values of the Pd@Pt$_{2.7L}$/C and commercial PVC catalysts. The ECSAs of these Pd@Pt$_{nL}$/C (n=0.7-4.3) catalysts were all comparable as compared to the commercial Pt/C catalyst, despite the fact that their average particle sizes (14.9 nm) were approximately five times larger than those of Pt/C catalyst (3.2 nm).

Figure 21:
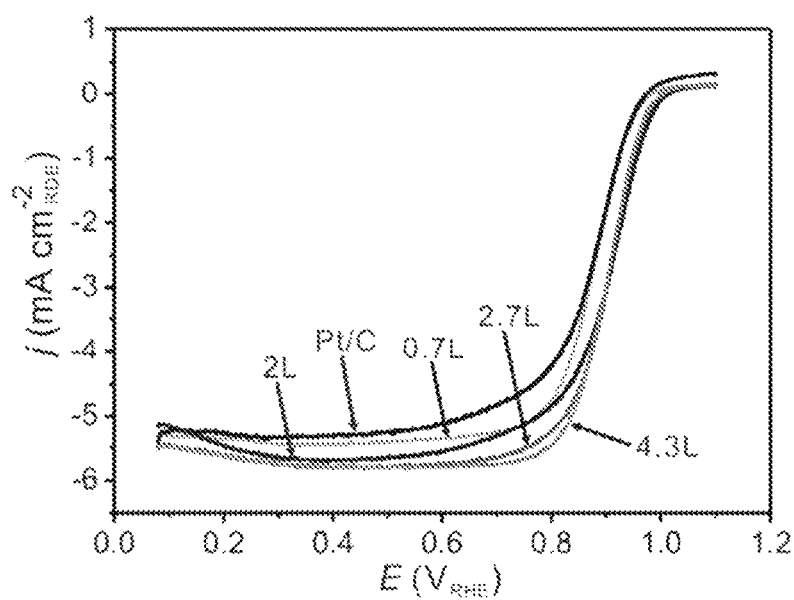
FIG. 21 shows the positive-going ORR polarization curves for the Pd@Pt$_{nL}$/C (n=0.7, 2, 2.7, 43) icosahedra and commercial Pt/C catalysts at room temperature in O$_2$-saturated 0.1 M aqueous HClO$_4$ solutions.

The positive-going ORR polarization curves of the Pd@Pt$_{nL}$/C (n=0.7-4.3) catalysts are shown in FIG. 21. To better understand the surface and mass effects, we calculated the kinetic currents from the ORR polarization curves according to the Koutecky-Levich equation and then normalized the kinetic current to the ECSA (j$_{k,specific}$) and platinum mass respectively. The specific and mass activities of the Pd@Pt$_{nL}$/C catalysts were greatly enhanced in the potential region of 0.86 to 0.94 V compared to the state-of-the-art commercial Pt/C catalyst. At 0.9 V (vs. RHE), the j$_{k,specific}$ values of the different Pd@Pt$_{nL}$/C (n=0.7-4.3) catalysts were found to show a volcano shaped dependence based on the number of platinum atomic overlayers (see FIG. 22A). For the Pd@Pt$_{2.7L}$/C catalyst, j$_{k,specific}$ was 1.36 mA cm$^{-2}_{Pt}$ which was 7.8 times higher than that of the control Pt/C catalyst (0.174 mA cm$^{-2}_{Pt}$).

The mass activity, j$_{k,mass}$, of the Pd@Pt$_{2.7L}$/C catalyst was 0.64 A mg$^{-1}_{Pt}$ which is 7.2 times higher than that of the control Pt/C catalyst (0.089 A mg$^{-1}_{Pt}$). The mass activities of Pd@Pt$_{nL}$/C (n=0.7-4.3) and commercial Pt/C catalysts are shown in FIG. 22B.

In addition to the greatly enhanced specific and mass activities, the Pd@Pt$_{2.7L}$/C catalyst exhibited excellent thermal stability and electrochemical durability. Under in situ heating, the corrugated surface of Pd@Pt$_{2.7L}$/C icosahedra could be well preserved even after heating at 300° C. for 30 min (see TEM images in FIGS. 23A & 23B). The catalytic durability of the Pd@Pt$_{2.7L}$/C sample was evaluated from both the specific ECSAs and j$_{k,mass}$ at 0.9 V, the catalytic durability of the Pd@Pt$_{2.7L}$/C catalyst was greatly improved relative to that of the commercial Pt/C catalyst (see FIGS. 24 A & B). After 5,000 cycles, the Pd@Pt$_{2.7L}$/C catalyst only exhibited an 8% drop in the specific ECSA, as opposed to the 54% drop in the ESCA of the control Pt/C catalyst after the same number of cycles. Even after 10,000 cycles, the specific ESA of the Pd@Pt$_{2.7L}$/C (26.5 m$^2$ g$^{-1}_{Pt}$) was still higher than that of the commercial PVC (23.5 m$^2$ g$^{-1}_{Pt}$) after only 5,000 cycles. At 0.9 V, the mass activity of the Pd@Pt$_{2.7L}$/C catalyst after 10,000 cycles showed four-fold enhancement relative to the pristine Pt/C catalyst prior to durability test.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

The invention claimed is:

1. A fuel cell comprising a core-shell nanostructure, wherein the core-shell nanostructure comprises a palladium nano-substrate conformally coated with between one and ten continuous uniform and smooth atomic overlayers of epitaxially deposited zero-valent platinum atoms over the whole surface of the palladium nano-substrate, wherein the palladium nano-substrate has a shape selected from the group consisting of cubic, concave cubic, tetrahedral, bipyramidal, octahedral, icosahedral, decahedral, rod, bar, and wire.

2. The fuel cell of claim 1, wherein the palladium nano-substrate shape is perfect or wherein edges and/or corners of the palladium nano-substrate shape are truncated.

3. The fuel cell of claim 1, wherein the palladium nano-substrate has {100}, {111} facets and/or twin defects on the nano-substrate surface.

4. The fuel cell of claim 1, wherein the one to ten zero-valent platinum overlayers formed on the palladium nano-substrate have a corrugated surface morphology.

5. The fuel cell of claim 1, wherein the core-shell nanostructure has a size of about one to about one hundred nanometers.

6. The fuel cell of claim 1, wherein the core-shell nanostructure has a shape selected from the group consisting of cubic, octahedral, and icosahedral shapes; and the core-shell nanostructure shapes are perfect or truncated.

7. The fuel cell of claim 1, wherein the core-shell nanostructure is produced by the method comprising
   (a) combining a first solution comprising a plurality of palladium nano-substrates and a reducing agent with a second solution comprising a platinum-containing compound to form a mixture, wherein the palladium nano-substrate has a shape selected from the group consisting of cubic, concave cubic, tetrahedral, bipyramidal, octahedral, icosahedral, decahedral, rod, bar, and wire; and
   (b) heating the mixture at a temperature in the range of about 75° C. to about 250° C. to induce epitaxial layer-by-layer deposition of one or more zero-valent platinum overlayers conformally deposited on the palladium nano-substrates, to produce between one and ten platinum atomic overlayers.

8. The fuel cell of claim 1, wherein the core-shell nanostructure is incorporated into an electrode of the fuel cell.

9. The fuel cell of claim 1, wherein the core-shell nanostructure is an electrocatalyst for hydrogen oxidation reaction.

10. The fuel cell of claim 9, wherein the core-shell nanostructure is incorporated at an anode of the fuel cell.

11. The fuel cell of claim 1, wherein the core-shell nanostructure is an electrocatalyst for oxygen reduction reaction.

12. The fuel cell of claim 11, wherein the core-shell nanostructure is incorporated at a cathode of the fuel cell.

13. The fuel cell of claim 1, wherein the core-shell nanostructure is incorporated in an electrically conductive support.

14. The fuel cell of claim 13, wherein the electrically conductive support comprises carbon, graphite, carbon nanotubes, carbon nanofibers, mesoporous carbon, graphene, acetylene black, or Ketjen black.

15. The fuel cell of claim 1, wherein the core-shell nanostructure has an electrochemically active surface area of at least 10 $m^2$ per gram of platinum in the core-shell nanostructure.

16. The fuel cell of claim 1, wherein the core-shell nanostructure has an electrochemically active surface area of 15 $m^2$ per gram of platinum to 125 $m^2$ per gram of platinum in the core-shell nanostructure.

17. The fuel cell of claim 1, wherein the core-shell nanostructure has a mass activity in the amount of 0.1 A per mg of platinum to 1.0 A per mg of platinum.

18. The fuel cell of claim 1, wherein the fuel cell comprises a proton exchange membrane fuel cell.

19. A core-shell nanostructure comprising a palladium nano-substrate conformally coated with between one and ten continuous uniform and smooth overlayers of epitaxially deposited zero-valent platinum atoms over the whole surface of the palladium nano-substrate, the method comprising the steps of:
   (a) combining a first solution comprising a plurality of palladium nano-substrates and a reducing agent with a second solution comprising a platinum-containing compound to form a mixture, wherein the palladium nano-substrate has a shape selected from the group consisting of cubic, concave cubic, tetrahedral, bipyramidal, octahedral, icosahedral, decahedral, rod, bar, and wire; and
   (b) heating the mixture at a temperature in the range of about 75° C. to about 250° C. to induce epitaxial layer-by-layer deposition of one or more zero-valent platinum overlayers conformally deposited on the palladium nano-substrates, to produce between one and ten platinum atomic overlayers.

* * * * *